· US011348955B2

United States Patent
Chen et al.

(10) Patent No.: US 11,348,955 B2
(45) Date of Patent: May 31, 2022

(54) PIXEL STRUCTURE FOR IMAGE SENSORS

(71) Applicant: BRILLNICS SINGAPORE PTE. LTD., Singapore (SG)

(72) Inventors: Hsin-Li Chen, Hsinchu (TW); Yulin Tsai, Hsinchu (TW)

(73) Assignee: BRILLNICS SINGAPORE PTE. LTD., Singapore (SG)

(*) Notice: Subject to any disclaimer, the term of this patent is extended or adjusted under 35 U.S.C. 154(b) by 134 days.

(21) Appl. No.: 16/431,016

(22) Filed: Jun. 4, 2019

(65) Prior Publication Data

US 2019/0371845 A1 Dec. 5, 2019

Related U.S. Application Data

(60) Provisional application No. 62/700,382, filed on Jul. 19, 2018, provisional application No. 62/680,603, filed on Jun. 5, 2018.

(51) Int. Cl.
*H01L 27/14* (2006.01)
*H01L 27/146* (2006.01)

(52) U.S. Cl.
CPC .... *H01L 27/14614* (2013.01); *H01L 27/1463* (2013.01); *H01L 27/14616* (2013.01); *H01L 27/14643* (2013.01)

(58) Field of Classification Search
CPC ........... H01L 27/14616; H01L 27/1463; H01L 27/14643
See application file for complete search history.

(56) References Cited

U.S. PATENT DOCUMENTS

| 8,766,190 | B2 | 7/2014 | Sa | |
|---|---|---|---|---|
| 9,570,494 | B1* | 2/2017 | Jerome | H01L 27/14643 |
| 10,163,963 | B2* | 12/2018 | Janssens | H01L 27/14638 |
| 2007/0187734 | A1* | 8/2007 | Adkisson | H01L 27/1463 257/293 |
| 2010/0117126 | A1* | 5/2010 | Takahashi | H01L 27/14652 257/292 |
| 2011/0109762 | A1 | 5/2011 | Park et al. | |
| 2013/0015513 | A1 | 1/2013 | Kido et al. | |
| 2013/0320420 | A1 | 12/2013 | Kao et al. | |
| 2015/0228693 | A1* | 8/2015 | Toda | H01L 27/1463 257/40 |

OTHER PUBLICATIONS

Gilblom et al., "Real-time color imaging with a CMOS sensor having stacked photodiodes", Proceedings of SPIE, 2004, pp. 1-11.
Ahmed et al., "MOS Capacitor Deep Trench Isolation for CMOS image sensors", IEDM, 2014, pp. 1-4.
(Continued)

*Primary Examiner* — Trang Q Tran
(74) *Attorney, Agent, or Firm* — Pillsbury Winthrop Shaw Pittman LLP

(57) ABSTRACT

Disclosure herein relates to a unit pixel structure incorporating multiple photodiodes is disclosed. The unit pixel is formed in a semiconductive stack. The unit pixel includes a sensor well region, a floating diffusion region, a first gate structure and a second gate structure. The first gate structure is disposed over the semiconductive stack and the second gate structure extends into the semiconductive stack.

51 Claims, 14 Drawing Sheets

(56) References Cited

OTHER PUBLICATIONS

Sasaki et al., "2.2um BSI CMOS image sensor with two layer photo-detector", Proceedings of SPIE, 2015, pp. 1-6.
Takemoto et al., "Multi-storied photodiode CMOS image sensor for multiband imaging with 3D technology", IEDM, 2015, pp. 1-4.
European Patent Office, Extended European Search Report issued in EP Patent Application No. 19178447.9, dated Apr. 3, 2020, pp. 1-6.

* cited by examiner

PIXEL STRUCTURE FOR IMAGE SENSORS

CROSS-REFERENCES TO RELATED APPLICATIONS

This application claims the benefit of U.S. Provisional Patent Application No. 62/680,603 filed on Jun. 5, 2018 and U.S. Provisional Patent Application No. 62/700,382 filed on Jul. 19, 2018, which are hereby incorporated by reference herein and made a part of specification.

BACKGROUND

1. Field

The present disclosure generally relates to a pixel structure for image sensors.

2. Description of Related Art

Image sensors commonly included in modern electronic devices are known. However, as electronic devices become smaller and the number of features in a single device increases, the available area in the electronic devices becomes increasingly scarce.

SUMMARY

Accordingly, one or more aspects of the instant disclosure provides a unit pixel structure that comprises a semiconductive stack having a front side and a back side opposite the front side. In some embodiments, the semiconductive stack comprises a first doped layer, a second doped layer disposed over the first doped layer, a third doped layer disposed over the second doped layer, and a fourth doped layer disposed over the third doped layer. In some embodiments, a sensor well region is formed within the fourth doped layer, a floating diffusion region is formed within the fourth doped layer and separate from the sensor well region. In some embodiments, a first gate structure is disposed over the semiconductive stack and positioned between the sensor well region and the floating diffusion region. In some embodiments, a second gate structure is arranged around the floating diffusion region and extending through the third doped layer.

In some embodiments, an area of the sensor well region is less than an area of the second doped layer. In some embodiments, the area of the sensor well region is in a range of about 10% to 90% of the area of the second doped layer. In some embodiments, the unit pixel structure further comprises a pinning implant region formed over the sensor well region in the fourth doped layer. In some embodiments, the first doped layer, the third doped layer, and the fourth doped layer are of a first dopant type, and the second doped layer is of a second dopant type, and the third doped layer has a heavier doping concentration than the fourth doped layer.

In some embodiments, a doping concentration of the third doped layer is about 1 to 10 times heavier than the fourth doped layer. In some embodiments, the first dopant type is p-type, and the second dopant type is n-type. In some embodiments, a thickness of the first doped layer ranges from about 0.1 µm to 3 µm, a thickness of the second doped layer ranges from about 0.5 µm to 3 µm, a thickness of the third doped layer ranges from about 0.1 µm to 1 µm, and a thickness of the fourth doped layer ranges from about 1 µm to 5 µm. In some embodiments, the first gate structure protrudes from the semiconductive stack and the second gate structure has a height less than a height of protrusion of the first gate structure.

In some embodiments, the second gate structure is formed on a periphery of the semiconductive stack structure and laterally surround the semiconductive stack structure. In some embodiments, the second gate structure penetrates through the entire semiconductive stack structure. In some embodiments, the second gate structure comprises a gate electrode and a gate insulating layer surrounding the gate electrode, wherein the gate insulating layer exposes from the back side of the semiconductive stack structure, and wherein the gate electrode and the gate insulating layer expose from front side. In some embodiments, the unit pixel structure further comprises a gate isolation well region extending across a thickness of the semiconductive stack structure and extending laterally along an inner periphery of the second gate structure.

In some embodiments, the unit pixel structure further comprises an isolation structure laterally surrounding the semiconductive stack structure, the isolation structure penetrating through the entire semiconductive stack structure. In some embodiments, the unit pixel structure further comprises a transfer region surrounding the second gate structure. In some embodiments, the transfer region comprises a doped layer of single dopant type having substantially uniform dopant distribution. In some embodiments, the transfer region comprises a doped layer of single dopant type having graded dopant distribution.

In some embodiments, the transfer region comprises a doped layer of dual dopant type having graded dopant distribution across a depth thereof. In some embodiments, the isolation structure comprises an insulator insert laterally surrounding the semiconductive stack structure; a dielectric layer encapsulating the insulator insert; a shallow well region being formed over the dielectric layer and the insulator insert; and a deep well region laterally surrounding the dielectric layer and the shallow well region. In some embodiments, the insulator insert is made of dielectric materials including oxide, nitride and oxynitride. In some embodiments, the isolation structure comprises a silicon insert laterally surrounding the semiconductive stack structure; a dielectric layer laterally surrounding the silicon insert; and a deep well region laterally surrounding the dielectric layer.

In some embodiments, the silicon insert is made of poly silicon. In some embodiments, a dopant type of the silicon insert is different from a dopant type of the second gate structure. In some embodiments, the dopant type of the silicon insert is p-type and the dopant type of the second gate structure is n-type. In some embodiments, the silicon insert is exposed from the front side, and electrically coupled to a voltage supply.

Accordingly, one or more embodiments of the instant disclosure provides an image sensor structure that comprises a semiconductive stack having a front side and a back side opposite the front side, the semiconductive stack comprises a first doped layer, a second doped layer disposed over the first doped layer, a third doped layer disposed over the second doped layer, and a fourth doped layer disposed over the third doped layer; and a plurality of unit pixels formed in the semiconductive stack and arranged in a matrix pattern, each one of the plurality of unit pixels comprises a sensor well region formed within the fourth doped layer, a floating diffusion region formed within the fourth doped layer and separate from the sensor well region, a first gate structure disposed over the semiconductive stack and positioned between the sensor well region and the floating diffusion region, and a second gate structure arranged around the floating diffusion region and extending through the third doped layer.

In some embodiments, the unit pixel further comprises a pinning implant region formed over the sensor well region in the fourth doped layer. In some embodiments, the first doped layer, the third doped layer, and the fourth doped layer are of a first dopant type, and the second doped layer is of a second dopant type, and the third doped layer has a heavier doping concentration than the fourth doped layer. In some embodiments, a doping concentration of the third doped layer is about 1 to 10 times heavier than the fourth doped layer. In some embodiments, the first dopant type is p-type, and the second dopant type is n-type.

In some embodiments, a thickness of the first doped layer ranges from about 0.1 µm to 3 µm, a thickness of the second doped layer ranges from about 0.5 µm to 3 µm, a thickness of the third doped layer ranges from about 0.1 µm to 1 µm, and a thickness of the fourth doped layer ranges from about 1 µm to 5 µm. In some embodiments, the first gate structure is protruding from the semiconductive stack and the second gate structure has a height less than a height of protrusion of the first gate structure. In some embodiments, the second gate structure forms a grid pattern in the semiconductive stack, and wherein the sensor well region, the first gate structure, and the floating diffusion of the unit pixel are formed within an opening of the grid pattern. In some embodiments, the image sensor structure further comprises a gate isolation well region extending across a thickness of the semiconductive stack and extending laterally along a periphery of the opening.

In some embodiments, an area of the sensor well region is less than an area of the opening of the grid pattern. In some embodiments, the area of the sensor well region range of about 10% to 90% of the area of the opening. In some embodiments, the second gate structure penetrates through the entire semiconductive stack. In some embodiments, the second gate structure comprises a gate electrode and a gate insulating layer surrounding the gate electrode, wherein the gate insulating layer exposes from the back side of the semiconductive stack, and wherein the gate electrode and the gate insulating layer expose from front side.

In some embodiments, first gate structures of the plurality of unit pixels are electrically coupled to a first voltage supply and the second gate structure is electrically coupled to a second voltage supply. In some embodiments, the image sensor structure further comprises an isolation structure forming a grid pattern that laterally surrounds each of the plurality of unit pixels, the isolation structure penetrating through the entire semiconductive stack, and the unit pixel of the plurality of unit pixels formed within an opening of the grid pattern. In some embodiments, the unit pixel structure further comprises a transfer region surrounding the second gate structure.

In some embodiments, the transfer region comprises a doped layer of single dopant type having substantially uniform dopant distribution. In some embodiments, the transfer region comprises a doped layer of single dopant type having graded dopant distribution. In some embodiments, the transfer region comprises a doped layer of dual dopant type having graded dopant distribution across a depth thereof. In some embodiments, the isolation structure comprises an insulator insert laterally surrounding the semiconductive stack; a dielectric layer encapsulating the insulator insert; a shallow well region being formed over the dielectric layer and the insulator insert; and a deep well region laterally surrounding the dielectric layer and the shallow well region.

In some embodiments, the insulator insert is made of dielectric materials including oxide, nitride and oxynitride. In some embodiments, the isolation structure comprises a silicon insert laterally surrounding the semiconductive stack; a dielectric layer laterally surrounding the silicon insert; and a deep well region laterally surrounding the dielectric layer. In some embodiments, the silicon insert is made of poly silicon.

In some embodiments, a dopant type of the silicon insert is different from a dopant type of the second gate structure. In some embodiments, the dopant type of the silicon insert is p-type and the dopant type of the second gate structure is n-type. In some embodiments, the silicon insert is exposed from the front side, and electrically coupled to a voltage supply. In some embodiments, an area of the sensor well region is less than an area of the opening of the grid pattern. In some embodiments, the area of the sensor well region range of about 10% to 90% of the area of the opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
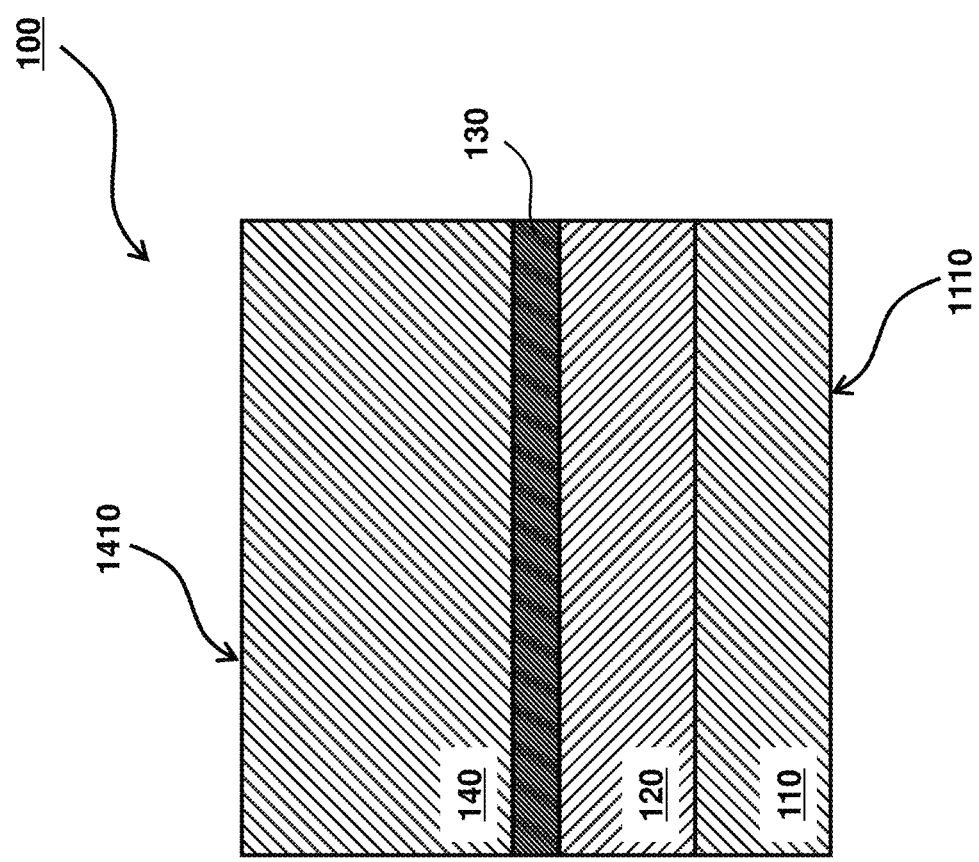
FIG. 1 illustrates a semiconductive stack according to some embodiment of the present disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As the area in the image sensor devices becomes increasingly limited, there is a need to develop an image sensor having sensing elements that are sensitive to optical signals of more than one spectrum range in a small area without compromising on the resolution. Accordingly, some embodiments described herein provide an image sensor having sensing elements that are sensitive to optical signals of more than one spectrum range in a small area without compromising the resolution.

In some embodiments, described in detail below, a semiconductive stack may be fabricated using epitaxial process, in which the layers of the semiconductive stack are epitaxially deposited layer by layer. As compared to high-energy implantation process, the epitaxial deposition process adopted in one or more embodiments described herein may help to minimize crystalline damages, offer increased accuracy in alignment/positioning, and improve confinement of doping profiles for individual inter-layers.

Referring now to FIG. 1, FIG. 1 illustrates semiconductive stack 100 for use in an image sensor device according to one or more embodiments described herein. As shown in FIG. 1 semiconductive stack 100 may include front side 1410 and back side 1110, which may be opposite front side 1410. Semiconductor stack 100 may include a first doped layer 110, a second doped layer 120 disposed on the first doped layer 110, a third doped layer 130 disposed on the second doped layer 120, and a fourth doped layer 140 disposed on the third doped layer 130. In some embodiments, doped layer 110, doped layer 120, doped layer 130, and doped layer 140 may form a device region for an unit pixel of an image sensor (not shown in FIG. 1). In some embodiments, described in further detail below, semiconductor stack 100 may include at least two photodiodes.

In some embodiments, the first doped layer 110, the third doped layer 130, and the fourth doped layer 140 include a first dopant type (not shown in FIG. 1) and the second doped layer 120 is of a second dopant type (not shown). In some embodiments, the third doped layer 130 may include a heavier concentration of dopant relative to the fourth doped layer 140. In some exemplary embodiments, the first dopant type may be p-type, and the second dopant type may be n-type. Semiconductive stack 100 including the first doped layer 110, the second doped layer 120, the third doped layer 130, and the fourth doped layer 140 may be utilized as a device region for a unit pixel of an image sensor, in which at least two photodiodes are formed, which is discussed in further detail below. It is noted that the type of doping disclosed above is merely an exemplary embodiment, and, in some embodiments, the order of dopant type may be switched. For example, in some embodiments, the order of the combination of the type of dopants of the first doped layer 110, the second doped layer 120, the third doped layer 130, and the fourth doped layer 140 may be different than as described above (e.g., the first dopant type may be n-type while the second dopant type may be p-type).

In some embodiments, the thickness of semiconductive stack 100 ranges from about 3.5 μm to 6 μm (as used herein "about" means the difference is negligible). In some embodiments, the thickness of the first doped layer 110 ranges from about 0.1 μm to 3 μm, a thickness of the second doped layer 120 ranges from about 0.5 μm to 3 μm, a thickness of the third doped layer 130 ranges from about 0.1 μm to 1 μm, and a thickness of the fourth doped layer 140 ranges from about 1 μm to 5 μm. In some embodiments, a combined thickness of the first doped layer 110 and the second doped layer 120 may be substantially (as used herein "substantially" means the difference is negligible) equal to a thickness of the fourth doped layer 140.

The pixel structure (not shown in FIG. 1) in accordance with one or more embodiments may be employed in either a front side illumination (FSI) or back side illumination (BSI) arrangement. In some embodiments, when semiconductive stack 100 is used for back side illumination image pixel, a combined thickness of the first doped layer 110 and the second doped layer 120 may be less than a thickness of the fourth doped layer 140. In some embodiments, when semiconductive stack 100 may be used for front side illumination pixel, a combined thickness of the first doped layer 110 and the second doped layer 120 may be greater than a thickness of the fourth doped layer 140.

In some embodiments, the first doped layer 110, the second doped layer 120, the third doped layer 130, and the fourth doped layer 140 are formed on a substrate (not shown) epitaxially and the substrate may be removed after the epitaxial process. The order of forming the doped layers (e.g., doped layers 110, 120, 130, 140) of semiconductive stack 100 is not limited by the exemplary embodiments. In some embodiments, the first doped layer 110 may be formed first on the substrate. In some other embodiment, the fourth doped layer 140 may be formed first on the substrate. In some embodiments, back side 1110 of semiconductive stack 100 may be treated to form uneven (e.g., rough surface) on the first doped layer 110 to help reflecting the incident light received by the unit pixels.

Figure 2:
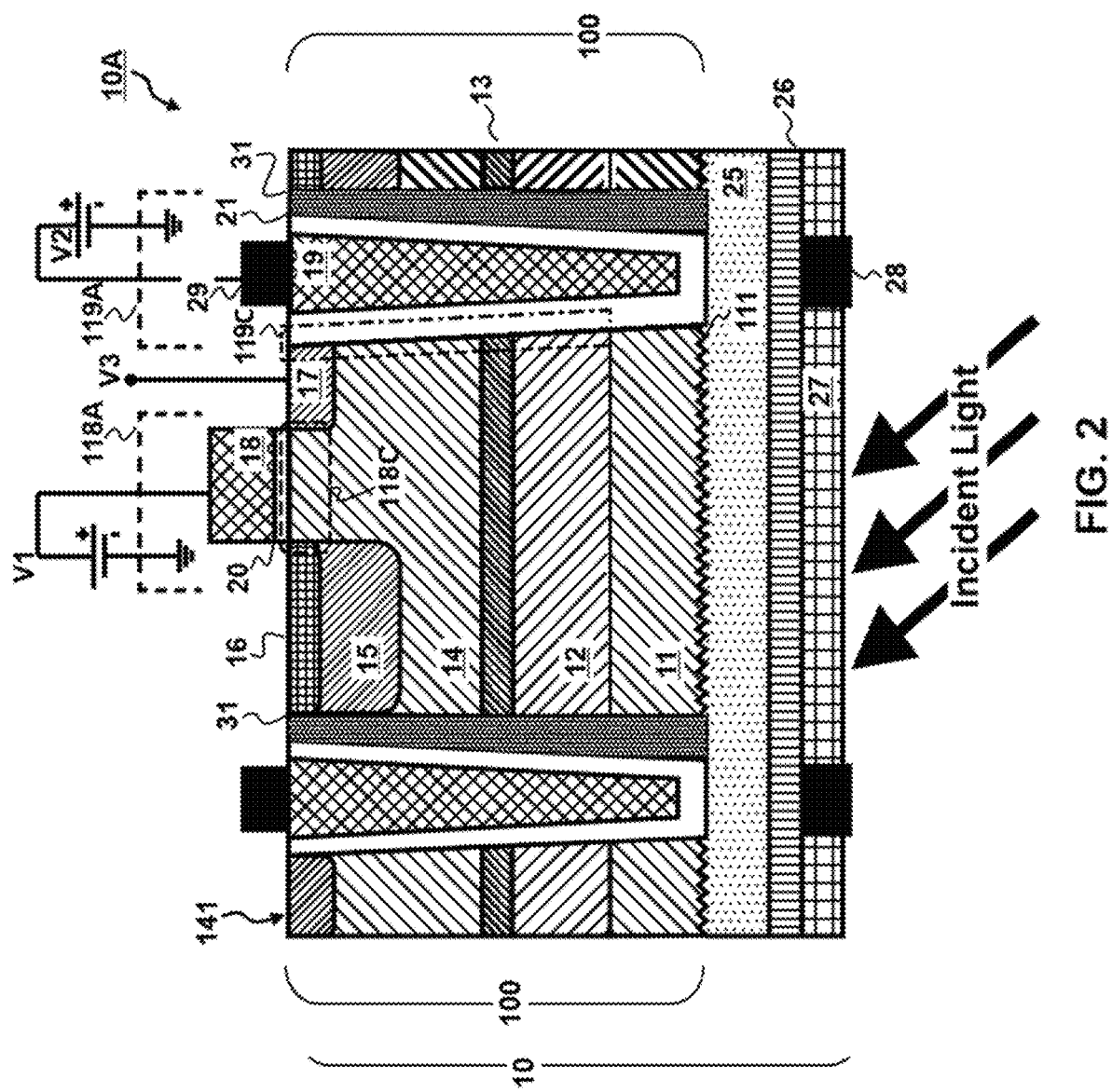
FIG. 2 illustrates a cross section of a unit pixel according to some embodiment of the present disclosure.
Figure 3:
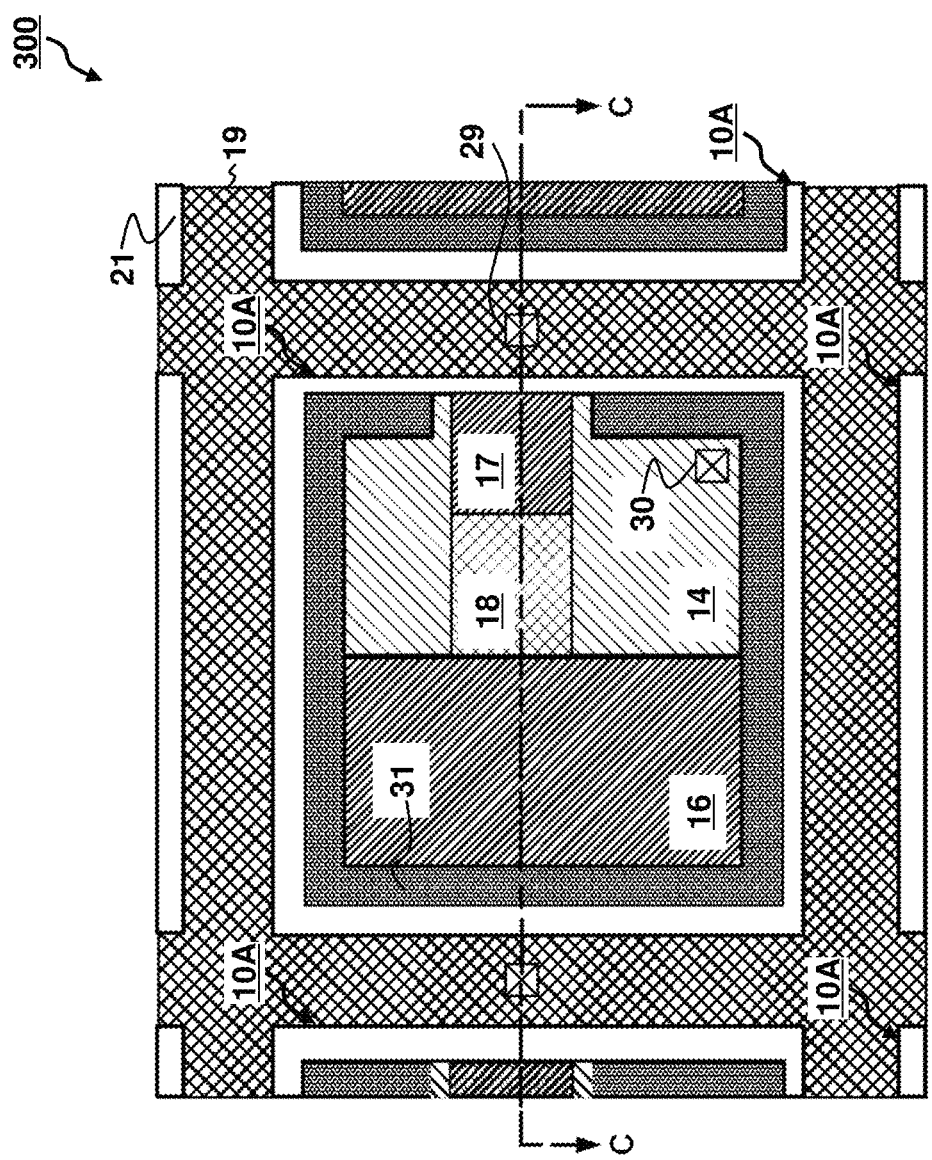
FIG. 3 illustrates a planar view of a front side of the unit pixel in FIG. 2.

Referring now to FIGS. 2 and 3, in conjunction with FIG. 1, FIG. 2 illustrates a cross section of an exemplary unit pixel 10A in accordance with one or more embodiments. FIG. 3 illustrates planar view of front side 1410 of unit pixel 10A in FIG. 2 for use in an image sensor device in accordance with one or more embodiments. The cross section in FIG. 2 is taken along line CC' of FIG. 3. 14. As shown in FIG. 3, in some embodiments, an image sensor 300 comprises a plurality of unit pixels 10A, for example. In some embodiments, unit pixels 10A may be arranged in a matrix, which is discussed in further detail below.

As shown in FIG. 2, in some embodiments, unit pixel 10A comprises semiconductive stack 100, sensor well region 15, floating diffusion region 17, gate structure 118A, and gate structure 119A. For clarity, gate structures 118A, 119A are depicted in FIG. 2 as broken lines showing the approximate location of gate structures 118A, 119A. However, the depiction of gate structures 118A, 119A as shown in FIG. 1 are not intended to be limiting, rather shown as an exemplary implementation. In some embodiments, gate structures 118A, 119A may encompass more, or less, of semiconductive stack 100. Gate structures 118A, 119A are described in further detail below. In one embodiment, an area of unit pixel 10A may be about a 3 μm by 3 μm. In another embodiment, sensor well region 15 may be formed within doped layer 14. In yet another embodiment, floating diffusion region 17 may be formed within doped layer.

In some embodiments, gate structure 118A may be a horizontal transfer gate (HTG). Gate structure 118A may be disposed over semiconductive stack 100 and positioned between sensor well region 15 and floating diffusion region 17. Gate structure 118A includes a gate electrode 18 and a gate insulating layer 20. Gate insulating layer 20 may be formed between semiconductive stack 100 and gate electrode 18. In some embodiments, an induced channel 118$c$ may induced by the charge of the gate electrode 18 on the fourth doped layer 140 between the sensor well region 15 and the floating diffusion region 17.

In some embodiments, gate structure 119A may be a vertical transfer gate (VTG). Gate structure 119A may be arranged around the floating diffusion region 17 and extending through doped layer 13, as shown in FIG. 2. As shown in FIG. 2 an induced channel 119$c$ for transferring stored charges to floating diffusion region 17 may be formed along an area of the lateral side of gate structure 119A free of the gate isolation well region 31.

In the embodiment shown in FIG. 3, gate structure 119A (not shown in FIG. 3) may be formed on a periphery of unit pixel 10A and penetrates through the entirety of semiconductive stack 100. Gate structure 119A includes gate electrode 19 and gate insulating layer 21. Gate insulating layer 21 of gate structure 119A may be exposed from front side 1410 and back side 1110 of semiconductive stack 100. In some embodiments, gate electrode 19 may be exposed from front side 1410 of semiconductive stack 100. The structural arrangement, as described above in accordance with the one or more embodiments, enables gate structure 119A to serve the dual roles of control gate (for one of the photo diodes) as well as pixel isolation structure, which is discussed in further detail below. Accordingly, the need for standalone pixel isolation structures (such as deep trench isolation) may be eliminated, thereby allowing more efficient utilization of valuable area budget.

In some embodiments, the height of gate structure 118A extending away from semiconductive stack 100 may be greater than the height of gate structure 119A extending away from semiconductive stack 100. In some embodiments, gate structure 119A may be substantially coplanar to front side 1410 of semiconductive stack 100. In some embodiments, unit pixel 10A further comprises gate isolation well region 31. Gate isolation well region 31 may extend across the width (i.e., thickness) of semiconductive stack 100. As shown in FIG. 3, gate isolation well region 31 may further extend laterally along inner periphery of gate structure 119A. In some embodiments, gate isolation well region 31 surrounds semiconductive stack 100 used to form unit pixel 10A. In some embodiments, gate isolation well region 31 may be a p-type well region.

Referring back now to FIG. 2, during operation, an induced channel 119C for transferring stored charges to floating diffusion region 17 may be formed along an area of the lateral side of gate structure 119A free of the gate isolation well region 31. In some embodiments, a width of induced channel 119$c$ may be less than or substantially equal to a width of floating diffusion region 17 surrounding gate structure 119A. In another embodiment, a width of the induced channel 119$c$ may be greater than a width of the floating diffusion region 17 surrounding gate structure 119A. In some embodiments, unit pixel 10A further includes pinning implant region 16 formed over sensor well region 15 in doped layer 14. The inclusion of pinning implant 16 may help to alleviate dark current issues. In some embodiments, the area of the pinning implant 16 may be substantially the same as the area of the sensor well region 15.

In some embodiments, unit pixel 10A may be a dual photodiode configuration, which enables the sensing of dual optical spectrums in a single unit pixel. For example, unit pixel 10A may include a first photodiode and a second photodiode stacked on top of each other. In some embodiments, the second doped layer 12 may be a part of the first photodiode and may be configured to be a short-wavelength photosensitive region used for detecting shorter wavelength spectrum of the incident light. The short wavelength spectrum includes visible lights. The third doped layer 13 may be used as an anti-spill-back layer configured to suppress the charges from being spilled back to doped layer 12 after completion of a charge transfer.

For example, the heavier doping of the third doped layer 13 builds a potential hump between the second doped layer 12 and the fourth doped layer 14 to support complete transfer of charges and to suppress signal lag. Sensor well region 15 may be part of the second photodiode and includes a n-type well formed within the fourth doped layer 14 to form a long-wavelength photosensitive region to detect the longer wavelength spectrum of the incident light. The longer wavelength spectrum may include the electromagnetic wave in the infrared spectrum. In some embodiments, an area of sensor well region 15 may be less than an area of the second doped layer 12 in an exemplary unit pixel 10A. The area of sensor well region 15 may be in a range of about 10% to 90% of the second doped layer 120 in one exemplary unit pixel 10A. In some embodiments, the area of sensor well region 15 may be as small as will be allowed by the design rule for the technology and as large as will be allowed by the design rule for the technology in relation to a gate and a neighboring diffusion region such as gate structure 118A and floating diffusion region 17.

In some embodiments, the pinning implant 16 includes a p-type doped region used to reduce dark current. The floating diffusion region 17 includes a n-type doped region. For a front side illumination using the present disclosure, the second doped layer 12 may be a part of the first photodiode and may be configured to be a long-wavelength photosensitive region used for detecting longer wavelength spectrum of the incident light. And, the sensor well region 15 may be a part of the second photodiode and includes a n-type well formed within the fourth doped layer 14 to form a short-wavelength photosensitive region to detect the shorter wavelength spectrum of the incident light.

In other embodiments, unit pixel 10A further includes a portion of the dielectric layer 25 covering the back side 111 of unit pixel 10. The dielectric layer 25 includes a high-k dielectric passivation material. The dielectric layer 25 covering the back side 111 may be used to suppress the generation of dark currents. The first doped layer 110 may be used as a buffer between the second doped layer 120. The dielectric layer 25 may be used to suppress generation of dark currents by isolating the second doped layer 12 from the dielectric layer 25. An insulating layer 26 may be further disposed over the back side 111. The insulating layer 26 covers the dielectric layer 25. The insulating layer 26 may be a dielectric material including silicon-dioxide, nitride, oxynitride. A metal grid pattern 28 may be formed over the insulating layer 26. The metal grid pattern may be made of material including tungsten, aluminum, copper. In some embodiments, the metal grid pattern 28 may be aligned with gate structure 119A. A passivation layer 27 may be further formed over the insulating layer 26. The passivation layer 27 may be a dielectric material including silicon-dioxide, nitride, oxynitride. The passivation layer 27 covering a portion of the lateral side of the metal grid pattern 28.

Figure 12:
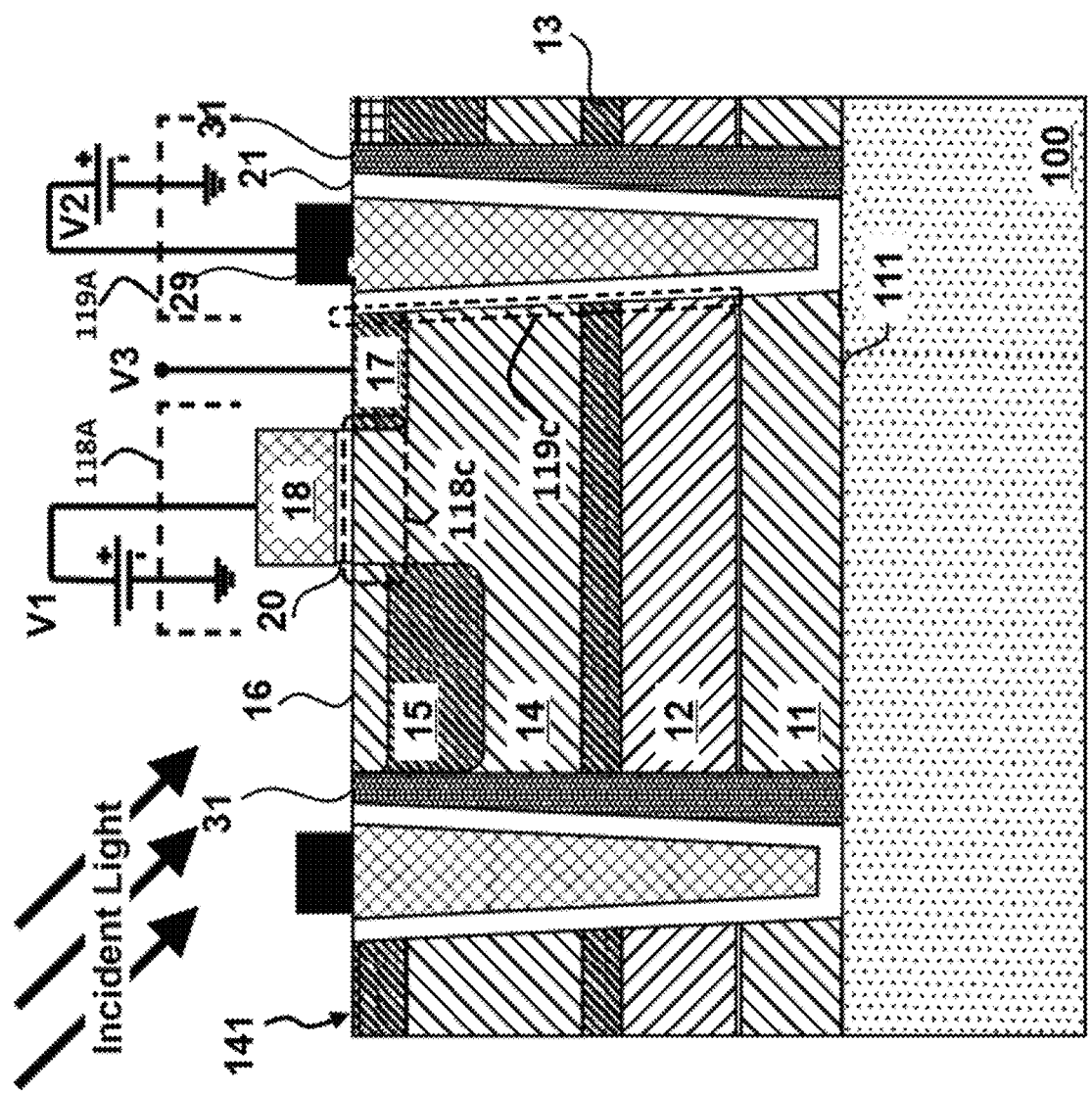
FIG. 12 illustrates a cross sectional view of a unit pixel according to some embodiment of the present disclosure.

To form a front side illumination using the present disclosure, the dielectric layer 25 covering back side 1110 of unit pixel 10A, the insulating layer 26, the metal grid pattern 28, and the passivation layer 27 are no longer formed on the structure. Instead, substrate 100' may be disposed on back side 1110 of unit pixel 10D as shown in FIG. 12. In some embodiments, substrate 100' may be the substrate used in forming semiconductive stack 100.

In some embodiments, an image sensor (for example, the same or similar to image sensor 300, 600) comprises a plurality of unit pixels 10A arranged in a matrix pattern (e.g. as shown in FIG. 3). Gate structure 119A forms a grid pattern in semiconductive stack 100. The sensor well region 15, gate structure 118A, and the floating diffusion region 17 of each unit pixel are formed within an opening of the grid pattern. In some embodiments, a sensing area of the second doped layer 12 for unit pixel 10A may be an area of the opening of the grid pattern.

The plurality of unit pixels 10A (e.g., as shown in FIG. 3) may share a common second gate structure (e.g., 119A). In some embodiments, the voltage supply V2 may be shared by gate electrodes 19 of plurality unit pixels in the image sensor. In some embodiments, the voltage supply V2 may be electrically coupled to contacts 29 disposed on the exposed portion of gate structure 119A closest to the induced channel (e.g., an area of the lateral side of gate structure 119A not laterally covered by the gate isolation well region 31). A first set of charges are stored in the first photodiode reflecting the incident light detected.

Upon activation of gate electrode 19, the first set of charges are transferred from the first photodiode to floating diffusion region 17 through channel 119c induced by the charge of the gate electrode 19 on semiconductive stack 100 between the second doped layer 12 and the floating diffusion region 17. A backend readout circuit (not shown) may be coupled to the floating diffusion region 17 through a terminal V3 to determine the amount of charges detected in the first photodiode. When operating the image sensor, a voltage supply V1 may be electrically coupled to gate electrode 18' of gate structure 118A. In some embodiments, the voltage supply V1 may be shared by the gate electrodes 18' of the plurality unit pixels in the image sensor (not shown).

In some embodiments, the voltage supply V1 electrically coupled to gate electrode 18 of each unit pixel 10A may be separate from other unit pixels 10A to activate the gate electrode 18 of different unit pixels 10A at different times. A second set of charges are stored in the second photodiode reflecting the incident light detected. Upon activation of gate electrode 18, the second set of charges are transferred from the second photodiode to the floating diffusion region 17 through a channel 118c induced by the charge of the gate electrode 18 on the fourth doped layer 140 between the sensor well region 15 and the floating diffusion region 17. A backend readout circuit may be coupled to the floating diffusion region 17 through a terminal V3 to determine the amount of charges detected in the second photodiode. In other words, the exemplary embodiment as shown in FIG. 2 supports an image sensor having a global shutter. On the other hand, with alternation of the surrounding gate arrangement (e.g., providing separated ring gates instead of a joined mesh pattern), it may be also possible to form individual ring gates that support rolling shutter operation.

Figure 4:
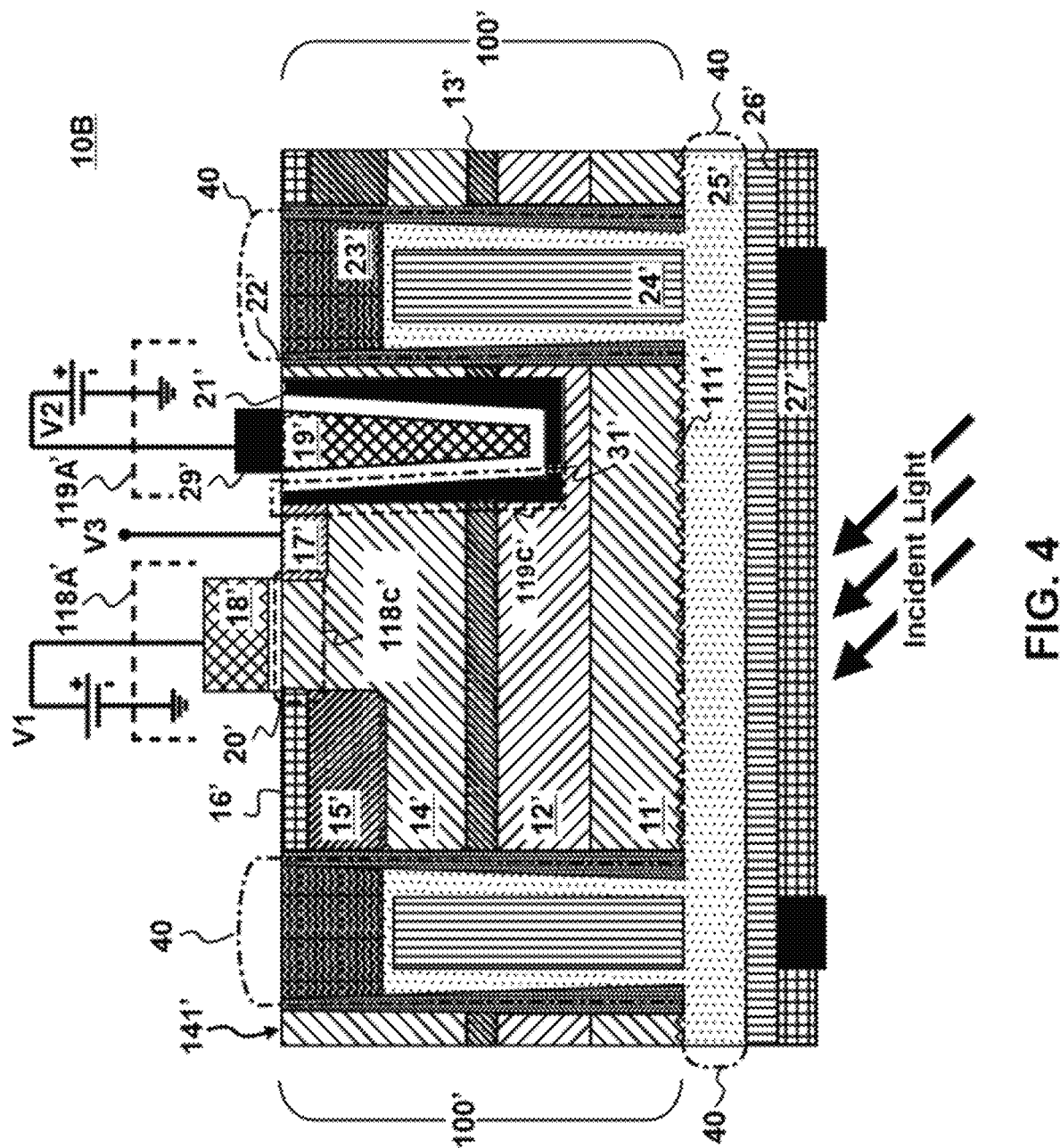
FIG. 4 illustrates a cross section of a unit pixel according to some embodiment of the present disclosure.
Figure 5:
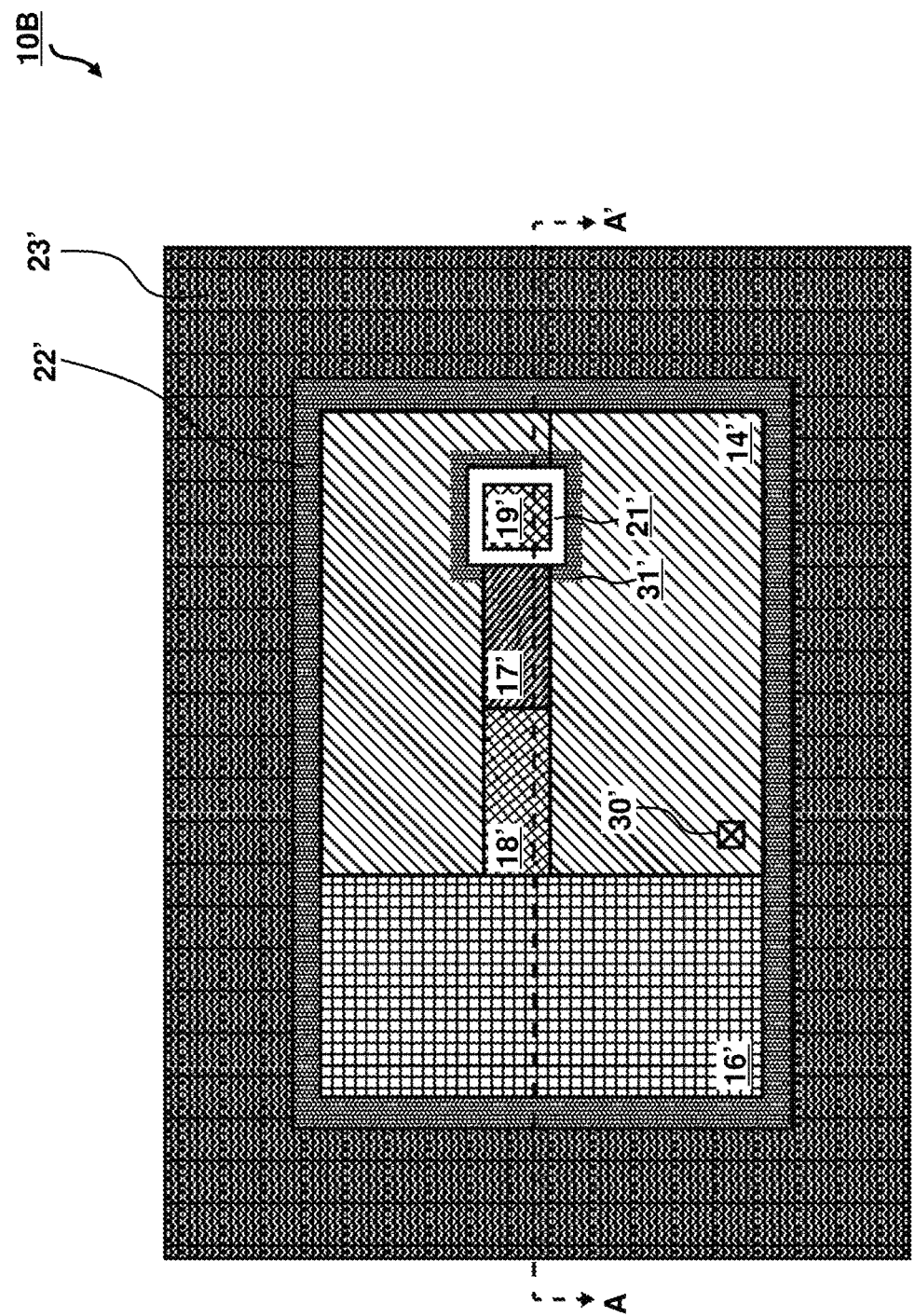
FIG. 5 illustrates a planar view of a front side of the unit pixel in FIG. 4 according to some embodiment of the present disclosure.
Figure 6:
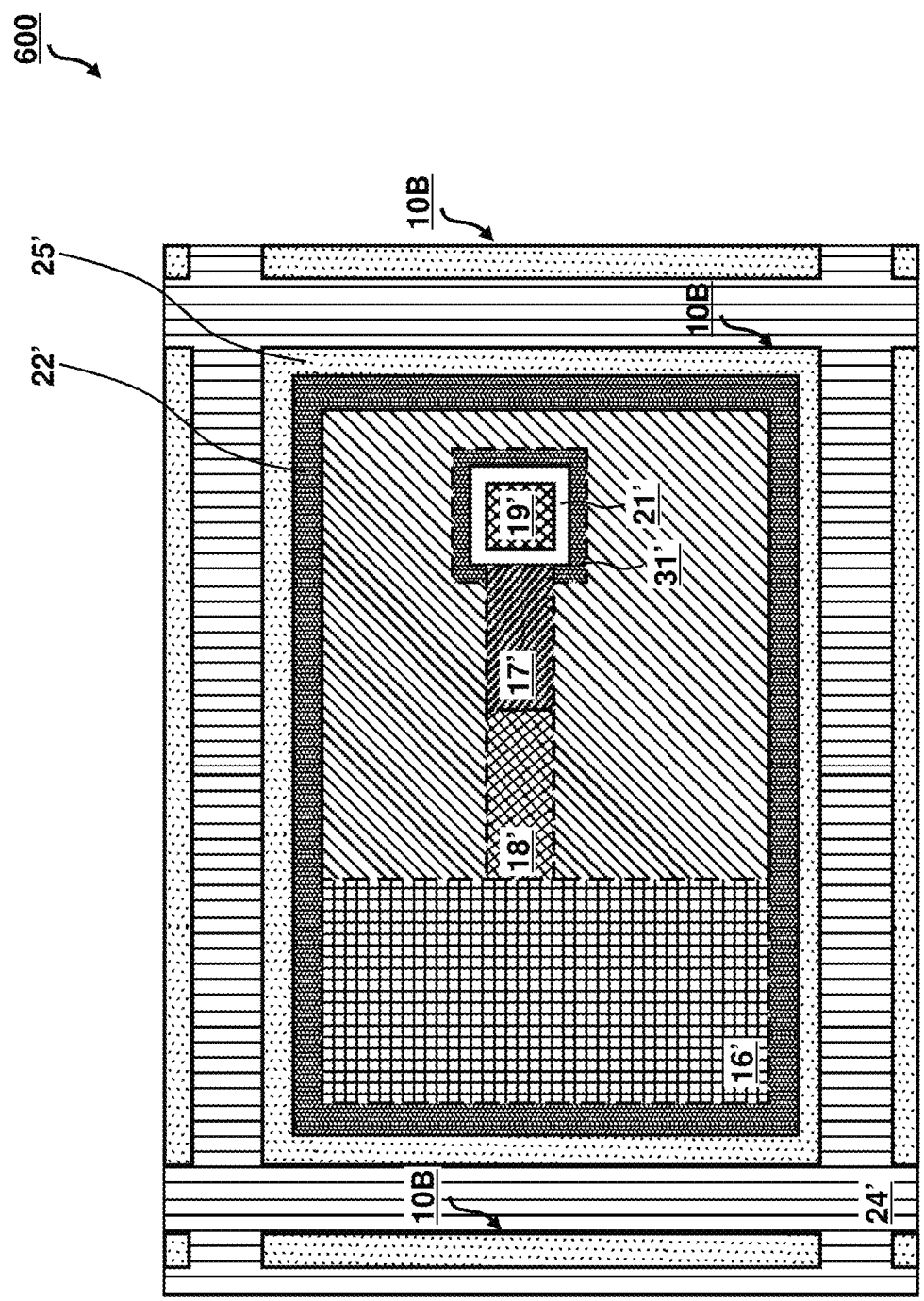
FIG. 6 illustrates a planar view of a back side of the unit pixel in FIG. 4 according to some embodiment of the present disclosure.

Referring now to FIGS. 4-6 in conjunction with FIGS. 1-3, FIG. 4 illustrates a cross section of a unit pixel 10B according to some embodiments of the present disclosure. FIG. 5 illustrates a planar view of a front side 1410 of unit pixel 10B in FIG. 4 according to one or more embodiments described herein. FIG. 6 illustrates a planar view of a back side 1110' of unit pixel 10B in FIG. 4 according to one or more embodiments described herein. The cross section in FIG. 4 is taken along line AA' of FIG. 5.

In some embodiments, an area of unit pixel 10B may be a 3 μm by 3 μm square area. In some embodiments, unit pixel 10B comprises semiconductive stack 100 in FIG. 1, sensor well region 15', floating diffusion region 17', a first gate structure 118A', and a second gate structure 119A'. Sensor well region 15' may be formed within doped layer 14'. Floating diffusion region 17' may be formed within the fourth doped layer 14'. Gate structure 118A' may be a horizontal transfer gate (HTG). Gate structure 118A' includes a gate electrode 18' and a gate insulating layer 20'. Gate structure 118A' may be disposed over semiconductive stack 100 and positioned between the sensor well region 15' and floating diffusion region 17'. Gate insulating layer 20' may be formed between semiconductive stack 100 and the gate electrode 18'. Gate structure 119A' may be a vertical transfer gate (VTG). Gate structure 119A' includes a gate electrode 19' and a gate insulating layer 21'. Gate structure 119A' may be arranged around floating diffusion region 17' and extending through the third doped layer 13'.

In some embodiments, gate structure 119A' penetrates through the first doped layer 11'. In other embodiments, gate structure 119A' does not penetrate through the first doped layer 11' and only partially penetrates through doped layer 12'. The height of gate structure 118A' extending away from semiconductive stack 100 may be greater than the height of gate structure 119A' extending away from semiconductive stack 100. In some embodiments, gate structure 119A' may be substantially planar to front side 1410' of semiconductive stack 100. The lateral side of gate structure 119A' may be where a channel may be formed for transferring of stored charges to floating diffusion region 17'.

In some embodiments, unit pixel 10B further includes an isolation structure 40 laterally surrounding unit pixel 10B. Isolation structure 40 may be penetrating through the entire semiconductive stack 100. Isolation structure 40 may be a passive isolation structure. As shown in FIG. 4, isolation structure 40 includes insulator insert 24', dielectric layer 25', shallow well region 23', and deep well region 22'. The insulator insert 24' laterally surrounds semiconductive stack 100. In some embodiments, the insulator insert 24' may be substantially planar to the back side 111'. Insulator insert 24' may be made of materials including oxide, nitride and oxynitride. Dielectric layer 25' encapsulates insulator insert 24'. Shallow well region 23' may be formed over dielectric layer 25' and insulator insert 24'. In some embodiments, shallow well region 23' may be substantially planar to front side 141'. In some embodiments, shallow well region 23' may be a p-type well region. Deep well region 22' may laterally surrounding dielectric layer 25' and shallow well region 23'. In some embodiments, deep well region 22' may be a p-type well region.

In some embodiments, unit pixel 10B further includes transfer region 31' surrounding gate structure 119A'. The transfer region 31' may be an area where the induced channel may be formed. In some embodiments, transfer region 31' may be doped with a doping profile that facilitates anti-blooming and suppresses dark current during exposure and accumulation of charges. In some embodiments, transfer region 31' includes a doped layer of single dopant type having substantially uniform dopant distribution. In other embodiments, transfer region 31' includes a doped layer of single dopant type having a graded dopant distribution. In other embodiments, transfer region 31' comprises a doped layer of dual dopant type having graded dopant distribution across a depth thereof. The portion of transfer region 31' closest to back side 111' may be of a first dopant type. And, the portion of the transfer region 31' closest to the front side 141' may be of a second dopant type. The first dopant type of the transfer region 31' gradually changes to the second dopant type of transfer region 31' along the lateral side of gate structure 119A'. In some embodiments, the first dopant type may be p-type while the second dopant type may be n-type. In some embodiments, unit pixel 10B further includes a pinning implant 16' used to reduce dark current formed over the sensor well region 15' in the fourth doped layer 14'. In some embodiments, the area of the pinning implant 16' may be substantially the same as the area of the sensor well region 15'.

In some embodiments, unit pixel 10B may be of a dual photodiode configuration, which enables the sensing of dual optical spectrums in a single unit pixel. Unit pixel 10B has a first photodiode and a second photodiode stacked on top of each other. In some embodiments, the second doped layer 12' may be a part of the first photodiode and may be configured to be a short-wavelength photosensitive region used for detecting shorter wavelength spectrum of the incident light. The short wavelength spectrum includes visible lights. The third doped layer 13' may be used as an anti-spill-back layer configured to suppress the charges from being spilled back to the second doped layer 12' after completion of a charge transfer. The heavier doping of the third doped layer 13' builds a potential hump between the second doped layer 12' and the fourth doped layer 14' to support complete transfer of charges and to suppress signal lag. The sensor well region 15' may be a part of the second photodiode and includes a n-type well formed within the fourth doped layer 14' to form a long-wavelength photosensitive region to detect the longer wavelength spectrum of the incident light. The long wavelength spectrum includes the infrared light. In some embodiments, an area of the sensor well region 15' may be less than an area of doped layer 12' in unit pixel 10B. The area of sensor well region 15' may be in a range of about 10 to 90% of the second doped layer 12' in an exemplary unit pixel 10B. In some embodiments, the area of the sensor well region may be as small as will be allowed by the design rule for the technology and as large as will be allowed by the design rule for the technology in relation to the gates and a neighboring diffusion region such as gate structure 118A', gate structure 119A', and floating diffusion region 17' Pinning implant 16' includes a p-type doped region used to reduce dark current. Floating diffusion region 17' includes a n-type doped region. For a front side illumination using the present disclosure, the second doped layer 12' may be a part of the first photodiode and may be configured to be a long-wavelength photosensitive region used for detecting longer wavelength spectrum of the incident light. And, the sensor well region 15' may be a part of the second photodiode and includes a n-type well formed within the fourth doped layer 14' to form a short-wavelength photosensitive region to detect the shorter wavelength spectrum of the incident light.

In other embodiments, unit pixel 10B further includes a portion of dielectric layer 25' covering back side 111' of unit pixel 10B. dielectric layer 25' includes a high-k dielectric passivation material. dielectric layer 25' covering the back side 111' may be used to suppress the generation of dark currents. The first doped layer 11' may be used as a buffer between the second doped layer 12'. Dielectric layer 25' may be used to suppress generation of dark currents by isolating the second doped layer 12' from dielectric layer 25'. Insulating layer 26' may be further disposed over back side 111'. Insulating layer 26' covers dielectric layer 25'. Insulating layer 26' may be a dielectric material including silicon-dioxide, nitride, oxynitride. A metal grid pattern 28' may be formed over insulating layer 26'. Metal grid pattern 28 may be made of material including tungsten, aluminum, copper. In some embodiments, metal grid pattern 28' may be aligned with gate structure 119A'. passivation layer 27' may be further formed over the insulating layer 26'. Passivation layer 27' may be a dielectric material including silicon-dioxide, nitride, oxynitride. Passivation layer 27' covering a portion of the lateral side of the metal grid pattern 28'.

Figure 13:
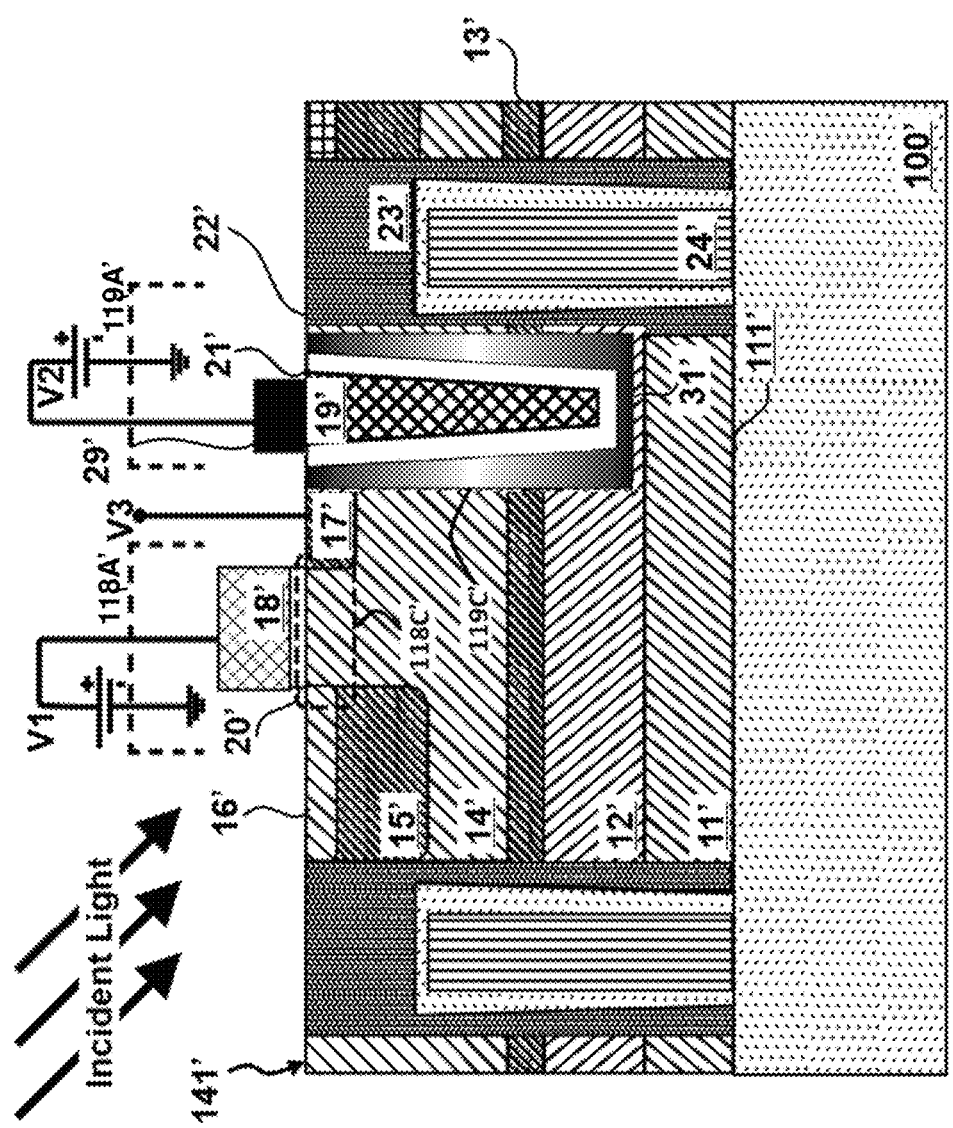
FIG. 13 illustrates a cross sectional view of a unit pixel according to some embodiment of the present disclosure.

In some embodiments, a front side illumination using the present disclosure may be formed wherein the dielectric layer 25' covering the back side 111' of unit pixel 10B, the insulating layer 26', the metal grid pattern 28', and the passivation layer 27' are no longer formed on device 10B. Instead, a substrate 100' may be disposed on the back side 111' of unit pixel 10E as shown in FIG. 13. In some embodiments, the substrate 100' may be the substrate used in forming semiconductive stack 100.

As shown in FIG. 6, in some embodiments, image sensor 600 may include a plurality of unit pixels 10B arranged in a matrix pattern, (the same or similar to the plurality of unit pixels 10A as shown in FIG. 3 for example). Isolation structure 40 may form a grid pattern in semiconductive stack 100. Each unit pixel 10B may be formed within an opening of the grid pattern. Isolation structure 40 may be used to isolate unit pixels 10B from each other. In some embodiments, a sensing area of doped layer 12' for unit pixel 10B may be substantially equal to an area of the opening of the grid pattern.

When operating the image sensor, a voltage supply V2 may be electrically coupled to the gate electrode 19' of gate structure 118A'. In some embodiments, the voltage supply V2 may be shared by the gate electrodes 19' of the plurality unit pixels in the image sensor. In other embodiments, the voltage supply V2 electrically coupled to the gate electrode 19' of each unit pixel 10B may be separate from other unit pixels 10B to activate the gate electrode 19' of different unit pixels 10B at different times. A first set of charges are stored in the first photodiode reflecting the incident light detected. Upon activation of the gate electrode 19', the first set of charges may be transferred from the first photodiode to floating diffusion region 17' through channel 119c induced by the charge of the gate electrode 19' on semiconductive stack 100 between the second doped layer 12' and floating diffusion region 17'. A backend readout circuit (not shown) may be coupled to floating diffusion region 17' through a terminal V3 to determine the amount of charges detected in the first photodiode. When operating the image sensor, a voltage supply V1 may be electrically coupled to the gate electrode 18' of gate structure 118A'. In some embodiments, the voltage supply V1 may be shared by the gate electrodes 18' of the plurality unit pixels in the image sensor. In other embodiments, the voltage supply V1 electrically coupled to the gate electrode 18' of each unit pixel 10B may be separate from other unit pixels 10B to activate the gate electrode 18 of different unit pixels 10B at different times. A second set of charges are stored in the second photodiode reflecting the incident light detected. Upon activation of the gate electrode 18', the second set of charges may be transferred from the second photodiode to floating diffusion region 17' through a channel induced by the charge of the gate electrode 18' on the fourth doped layer 14' between the sensor well region 15' and floating diffusion region 17'. A backend readout circuit may be coupled to floating diffusion region 17' through a terminal V3 to determine the amount of charges detected in the second photodiode.

Figure 7:
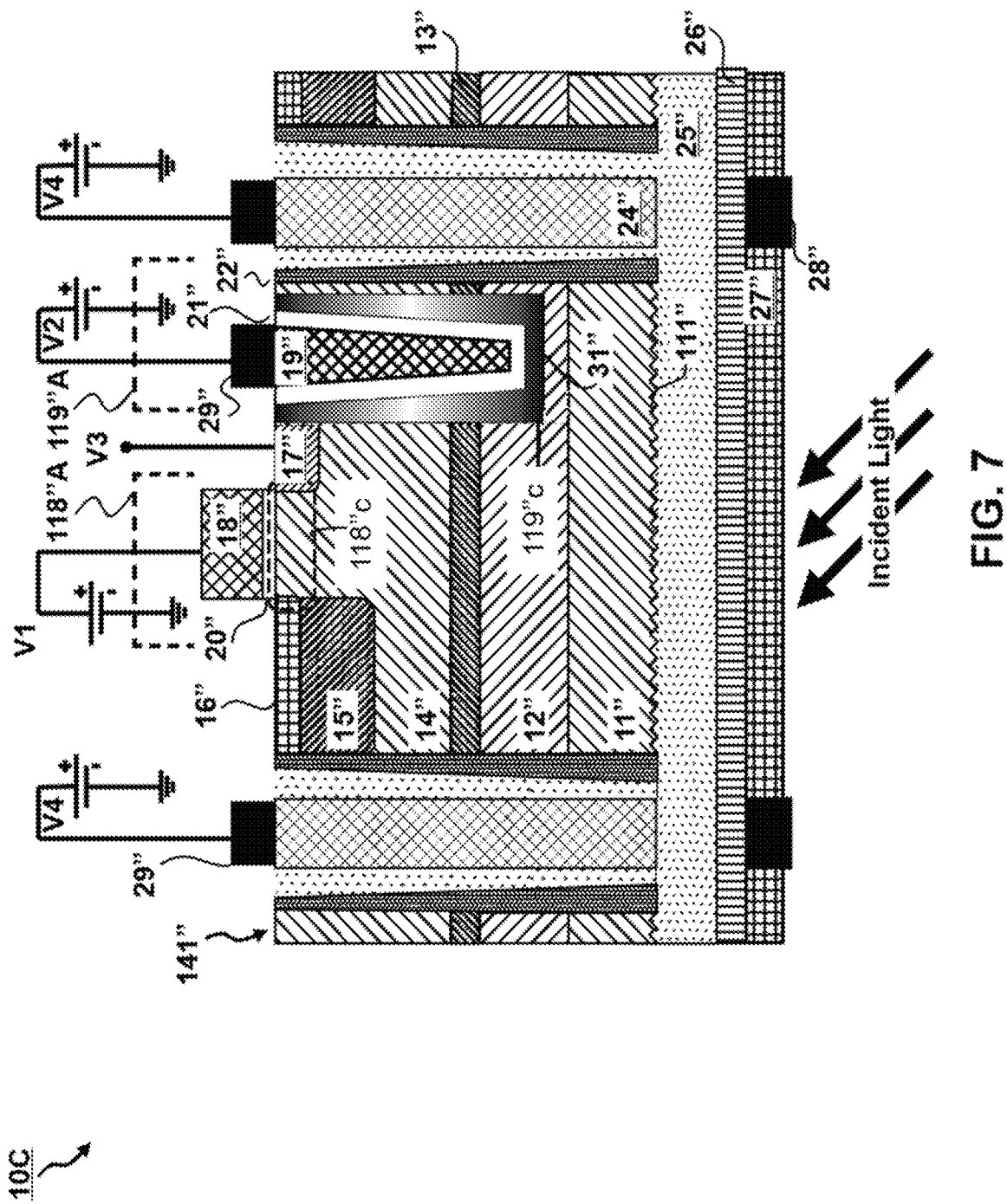
FIG. 7 illustrates a cross section of a unit pixel according to some embodiment of the present disclosure.
Figure 8:
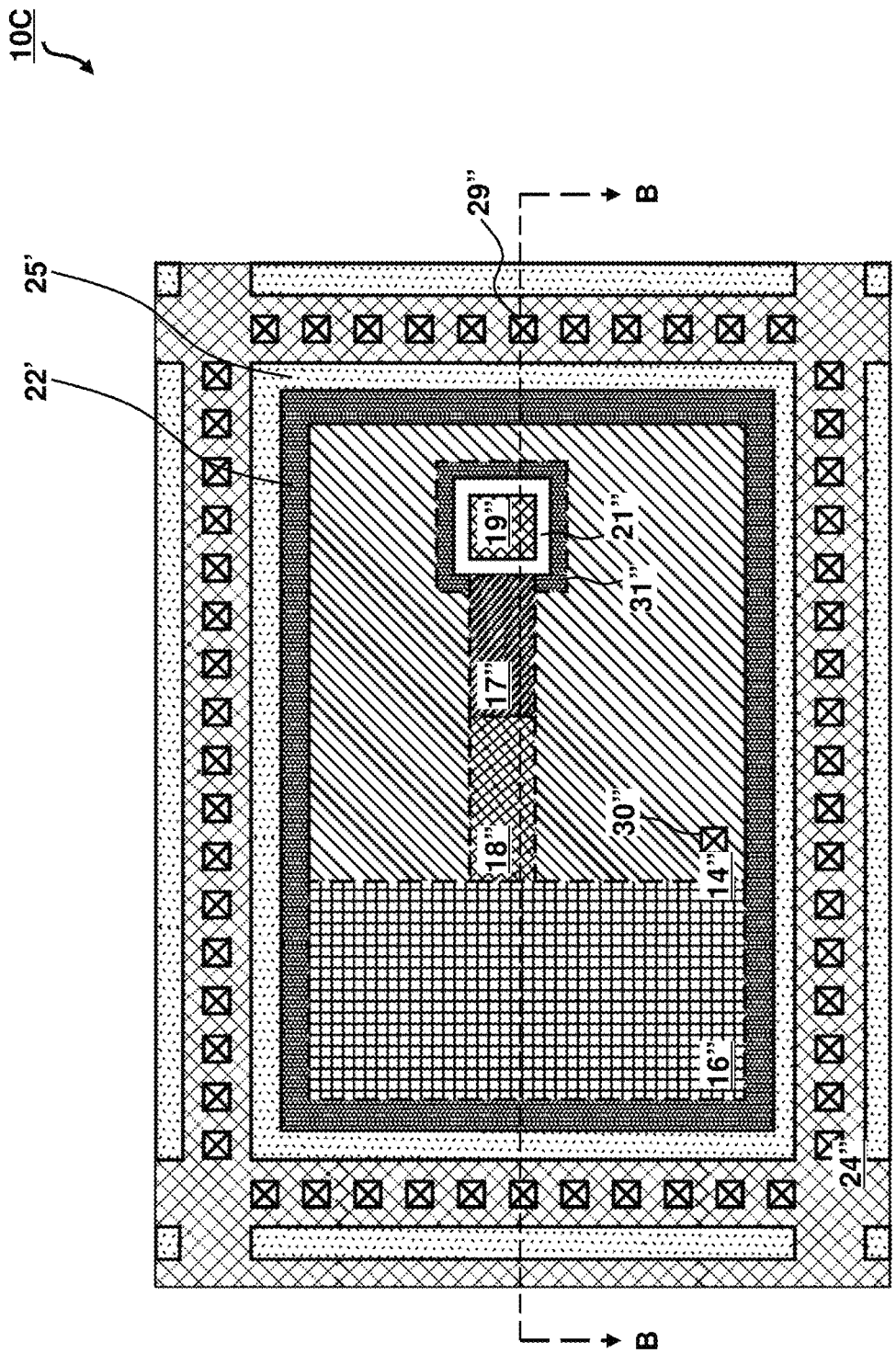
FIG. 8 illustrates a planar view of the unit pixel in FIG. 7 according to some embodiment of the present disclosure.

Referring now to FIGS. 7-8, FIG. 7 illustrates a cross section of unit pixel 10C according to some embodiment of the present disclosure. FIG. 8 illustrates a planar view of unit pixel 10C in FIG. 7 according to some embodiment of the present disclosure. The cross section in FIG. 7 may be taken along line BB' of FIG. 8. In some embodiments, an area of the unit pixel 10C may be a 3 μm by 3 μm square area. In some embodiments, unit pixel 10C comprises semiconductive stack 100 in FIG. 1, a sensor well region 15", a floating diffusion region 17", a first gate structure, and a second gate structure (for clarity the first and second gate structures are not shown in FIGS. 7-8). In some embodiments, the first gate structure and the second gate structure may be the same or similar to gate structures 118A, 119A, as described above.

In some embodiments, sensor well region 15" may be formed within the fourth doped layer 14". Floating diffusion region 17" may be formed within the fourth doped layer 14". Gate structure 118A" may be a horizontal transfer gate (HTG). Gate structure 118A" includes a gate electrode 18" and a gate insulating layer 20". Gate structure 118A" may be disposed over semiconductive stack 100" and positioned between sensor well region 15" and floating diffusion region 17". Gate insulating layer 20" may be formed between semiconductive stack 100" and the gate electrode 18". Gate structure 119A" may be a vertical transfer gate (VTG). Gate structure 119A" include a gate electrode 19" and a gate insulating layer 21". Gate structure 119A" may be arranged around floating diffusion region 17" and extending through the third doped layer 13".

In some embodiments, gate structure 119A" penetrates through the first doped layer 11". In other embodiments, gate structure 119A" does not penetrate through the first doped layer 11" and only partially penetrates through the second doped layer 12". The height of gate structure 118A" extending away from semiconductive stack 100 may be greater than the height of gate structure 119A" extending away from semiconductive stack 100. In some embodiments, gate structure 119A" may be substantially planar to the front side 141" of semiconductive stack 100. The lateral side of gate structure 119A" may be where a channel may be formed for transferring of stored charges to floating diffusion region 17".

In some embodiments, unit pixel 10C further includes an isolation structure laterally surrounding unit pixel 10C. Isolation structure 40 may be penetrating through the entire semiconductive stack. Isolation structure 40 may be an active isolation structure. Isolation structure 40 includes a silicon insert 24", a dielectric layer 25", and a deep well region 23". The silicon insert 24" may be laterally surrounding semiconductive stack 100". The silicon insert 24" may be made of poly silicon. A dopant type of the silicon insert 24" may be different from a dopant type of the gate electrode 19" of gate structure 119A". In some embodiments, the dopant type of the silicon insert 24" may be p-type and the dopant type of the gate electrodes 19" of gate structure 119A" may be n-type. The silicon insert 24" may be exposed from the front side 141" and may be electrically coupled to a voltage supply V4. The dielectric layer 25" may be laterally surrounding the silicon insert 24". The deep well region 22" may be laterally surrounding the dielectric layer 25". In some embodiments, deep well region 22" may be a p-type well region.

In some embodiments, unit pixel 10B further includes transfer region 31" surrounding gate structure 119A". Transfer region 31" may be an area where the induced channel may be formed. The transfer region 31" may be doped with a doping profile that facilitates anti-blooming and suppresses dark current during exposure and accumulation of charges. In some embodiments, transfer region 31" comprises a doped layer of single dopant type having substantially uniform dopant distribution. In other embodiments, transfer region 31' includes a doped layer of single dopant type having a graded dopant distribution. In other embodiments, transfer region 31" includes a doped layer of dual dopant type having graded dopant distribution across a depth thereof. The portion of the transfer region 31" closest to back side 111" may be of a first dopant type. And, the portion of the transfer region 31" closest to the front side 141" may be of a second dopant type. The first dopant type of transfer region 31" gradually changes to the second dopant type of transfer region 31" along the lateral side of gate structure 119A". In some embodiments, the first dopant type may be p-type while the second dopant type may be n-type. In some embodiments, unit pixel 10C further includes pinning implant 16" used to reduce dark current may be formed over sensor well region 15" in the fourth doped layer 14". In some embodiments, the area of pinning implant 16" may be substantially the same as the area of sensor well region 15".

In some embodiments, unit pixel 10C may be a dual photodiode configuration, which enables the sensing of dual optical spectrums in a single unit pixel. Unit pixel 10C has a first photodiode and a second photodiode stacked on top of each other. In some embodiments, the second doped layer 12" may be a part of the first photodiode and may be configured to be a short-wavelength photosensitive region used for detecting shorter wavelength spectrum of the incident light.

For example, the short wavelength spectrum includes visible lights. In some embodiments, the third doped layer 13" may be used as an anti-spill-back layer configured to suppress the charges from being spilled back to the second doped layer 12" after completion of a charge transfer. The heavier doping of the third doped layer 13" builds a potential hump between the second doped layer 12" and the fourth doped layer 14" to support complete transfer of charges and to suppress signal lag. The sensor well region 15" may be a part of the second photodiode and includes a n-type well formed within the fourth doped layer 14" to form a long-wavelength photosensitive region to detect the longer wavelength spectrum of the incident light. The long wavelength spectrum includes the infrared light.

In some embodiments, an area of the sensor well region 15" may be less than an area of the second doped layer 12" in one unit pixel 10C. The area of the sensor well region 15"

may be in a range of about 10 to 90% of the second doped layer 12" in one unit pixel 10C. In some embodiments, the area of the sensor well region may be as small as will be allowed by the design rule for the technology and as large as will be allowed by the design rule for the technology in relation to the gates and a neighboring diffusion region such as gate structure 118A", gate structure 119A", and floating diffusion region 17" Pinning implant 16" may include a p-type doped region used to reduce dark current. Floating diffusion region 17" includes a n-type doped region. When adopting the instantly disclosed unit pixel structure to the front side illumination device, as discussed above, the second doped layer 12" may be a part of the first photodiode and configured to be a long-wavelength photosensitive region used for detecting longer wavelength spectrum of the incident light. And, sensor well region 15" may be a part of second photodiode and includes a n-type well formed within the fourth doped layer 14" to form a short-wavelength photosensitive region to detect the shorter wavelength spectrum of the incident light.

In other embodiments, unit pixel 10C further includes a portion of the dielectric layer 25" covering the back side 111" of unit pixel 10C. Dielectric layer 25" includes a high-k dielectric passivation material. Dielectric layer 25" covering the back side 111" may be used to suppress the generation of dark currents. The first doped layer 11" may be used as a buffer between the second doped layer 12". Dielectric layer 25" may be used to suppress generation of dark currents by isolating the second doped layer 12' from dielectric layer 25". An insulating layer 26" may be further disposed over the back side 111". The insulating layer 26" covers dielectric layer 25". The insulating layer 26" may be a dielectric material including silicon-dioxide, nitride, oxynitride. Metal grid pattern 28" may be formed over the insulating layer 26". Metal grid pattern 28 may be made of material including tungsten, aluminum, copper. In some embodiments, the metal grid pattern 28" may be aligned with gate structure 119A". A passivation layer 27" may be further formed over the insulating layer 26". Passivation layer 27" may be a dielectric material including silicon-dioxide, nitride, oxynitride. Passivation layer 27" may cover a portion of the lateral side of metal grid pattern 28".

Figure 14:
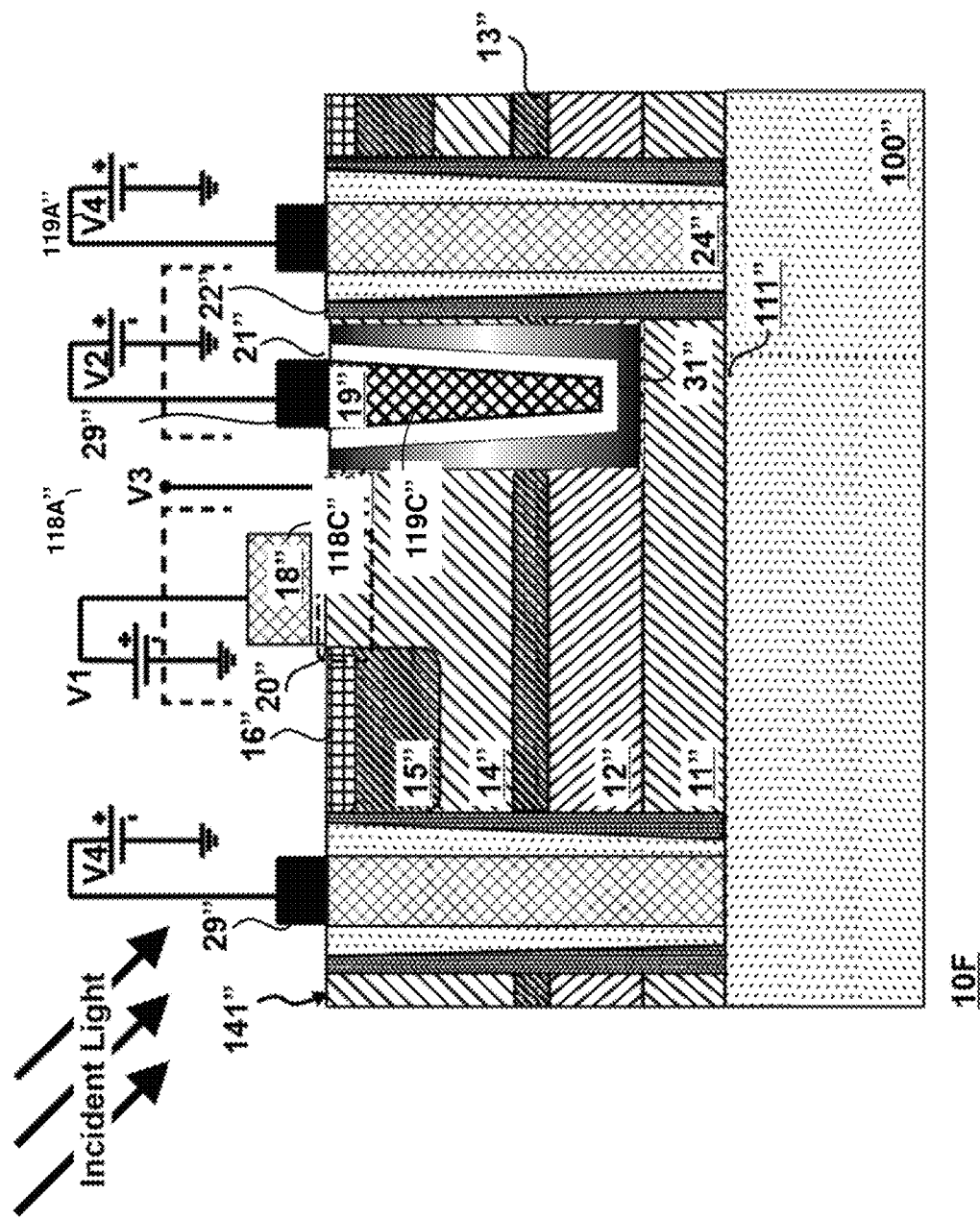
FIG. 14 illustrates a cross sectional view of a unit pixel according to some embodiment of the present disclosure.

In some embodiments, to form a front side illumination using the present disclosure, dielectric layer 25" covering the back side 111" of unit pixel 10C, the insulating layer 26", the metal grid pattern 28", and the passivation layer 27" are no longer formed on the device 10. Instead, a substrate 100" may be disposed on the back side 111" of unit pixel 10F as shown in FIG. 14. In some embodiments, the substrate 100" may be the substrate used in forming semiconductive stack 100.

In some embodiments, an image sensor comprises a plurality of unit pixels 10C arranged in a matrix pattern. Isolation structure 40 forms a grid pattern in semiconductive stack 100. Each unit pixel 10C may be formed within an opening of the grid pattern. In some embodiments, a sensing area of the second doped layer 12" for one unit pixel 10C may be substantially equal to an area of the opening of the grid pattern.

During operation of the image sensor, a voltage supply V2 may be electrically coupled to the gate electrode 19" of gate structure 118C". In some embodiments, the voltage supply V2 may be shared by the gate electrodes 19" of the plurality unit pixels in the image sensor. In other embodiments, the voltage supply V2 electrically coupled to the gate electrode 19" of each unit pixel 10C may be separate from other unit pixels 10C to activate the gate electrode 19" of different unit pixels 10C at different times. A first set of charges are stored in the first photodiode reflecting the incident light detected. Upon activation of the gate electrode 19", the first set of charges may be transferred from the first photodiode to floating diffusion region 17" through a channel induced by the charge of the gate electrode 19" on semiconductive stack 100 between the second doped layer 12" and floating diffusion region 17". A backend readout circuit may be coupled to floating diffusion region 17" through a terminal V3 to determine the amount of charges stored in the first photodiode. When operating the image sensor, a voltage supply V1 may be electrically coupled to the gate electrode 18" of gate structure 118A". In some embodiments, the voltage supply V1 may be shared by the gate electrodes 18" of the plurality unit pixels in the image sensor. In other embodiments, the voltage supply V1 electrically coupled to the gate electrode 18" of each unit pixel 10C may be separate from other unit pixels 10C to activate the gate electrode 18" of different unit pixels 10C at different times. A second set of charges are stored in the second photodiode reflecting the incident light detected. Upon activation of the gate electrode 18", the second set of charges may be transferred from the second photodiode to floating diffusion region 17" through a channel induced by the charge of the gate electrode 18" on the fourth doped layer 14" between the sensor well region 15" and floating diffusion region 17". A backend readout circuit (not shown) may be coupled to floating diffusion region 17" through a terminal V3 to determine the amount of charges stored in the second photodiode.

For the embodiments as illustrated in FIG. 2, FIG. 4, and FIG. 7, a plurality of contacts (e.g., 29, 29', and 29") may be formed on the exposed portion of gate structure 119A (e.g., from the front side 141, 141' and 141") to electrically couple respective voltage supplies and output terminals such as the terminal V3. As illustrated in FIG. 3, FIG. 5, and FIG. 8 contact 30, 30', and 30" may be further disposed on and electrically coupled to the fourth doped layer 14, 14', and 14" to electrically couple the fourth doped layer 14, 14', and 14" to bias voltage supply or a ground terminal. The fourth doped layer 14, 14', and 14" may be used as a bulk or a body of the corresponding unit pixel. The contacts 29, 29', 29", 30, 30', and 30" shown in FIGS. 2 to 8 are used to show parts of unit pixels 10A, 10B, and 10C having electrical coupling to circuits outside unit pixels 10A, 10B, and 10C. Nevertheless, it should be noted that the number of contacts 29, 29', 29", 30, 30', and 30" as shown in FIGS. 2 to 8 are not meant to be used as a limitation for the exact positioning or the number of contacts to be used by unit pixels 10A, 10B, and 10C.

Figure 9:
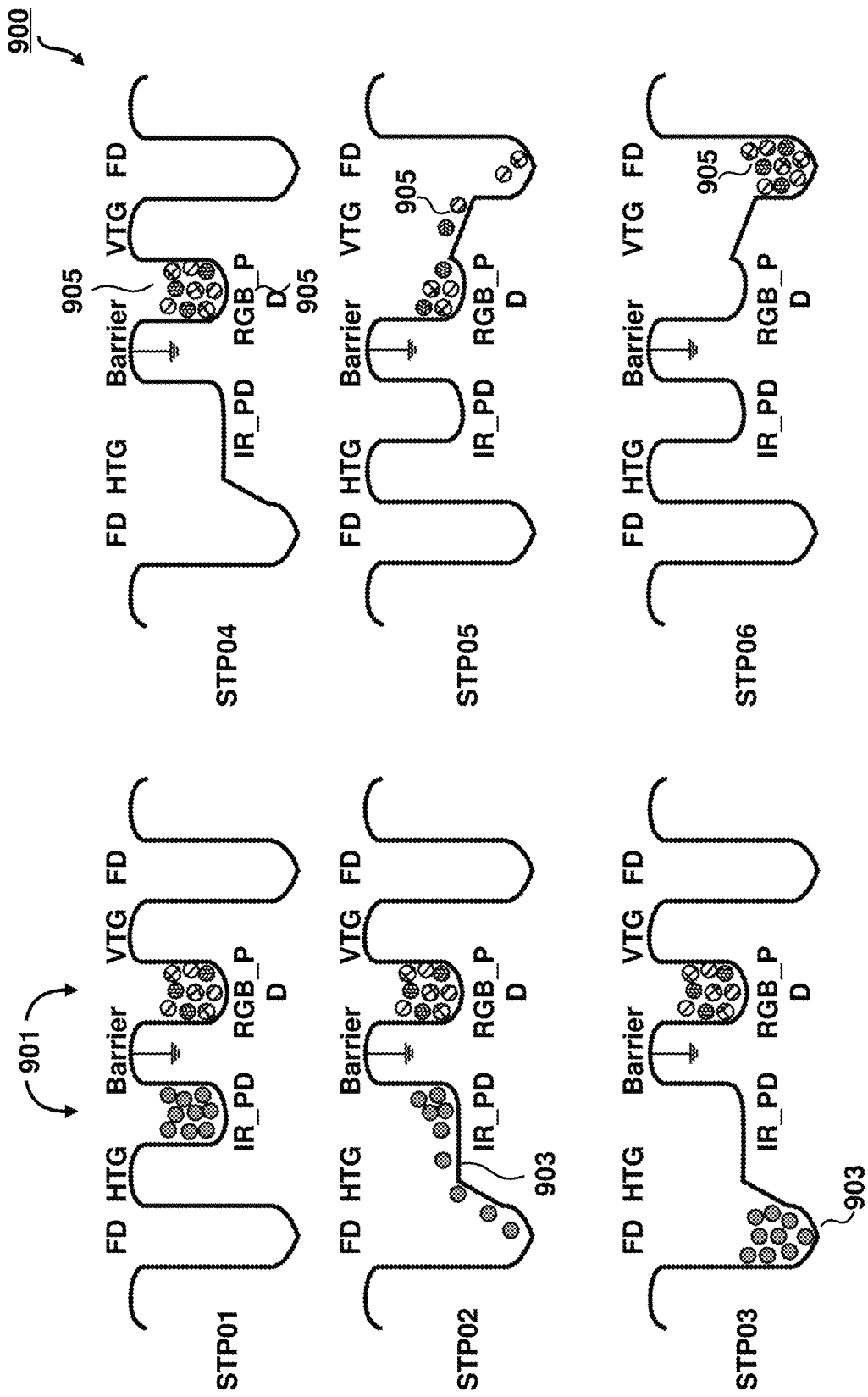
FIG. 9 illustrates a band diagram of a unit pixel according to some embodiment of the present disclosure.
Figure 10:
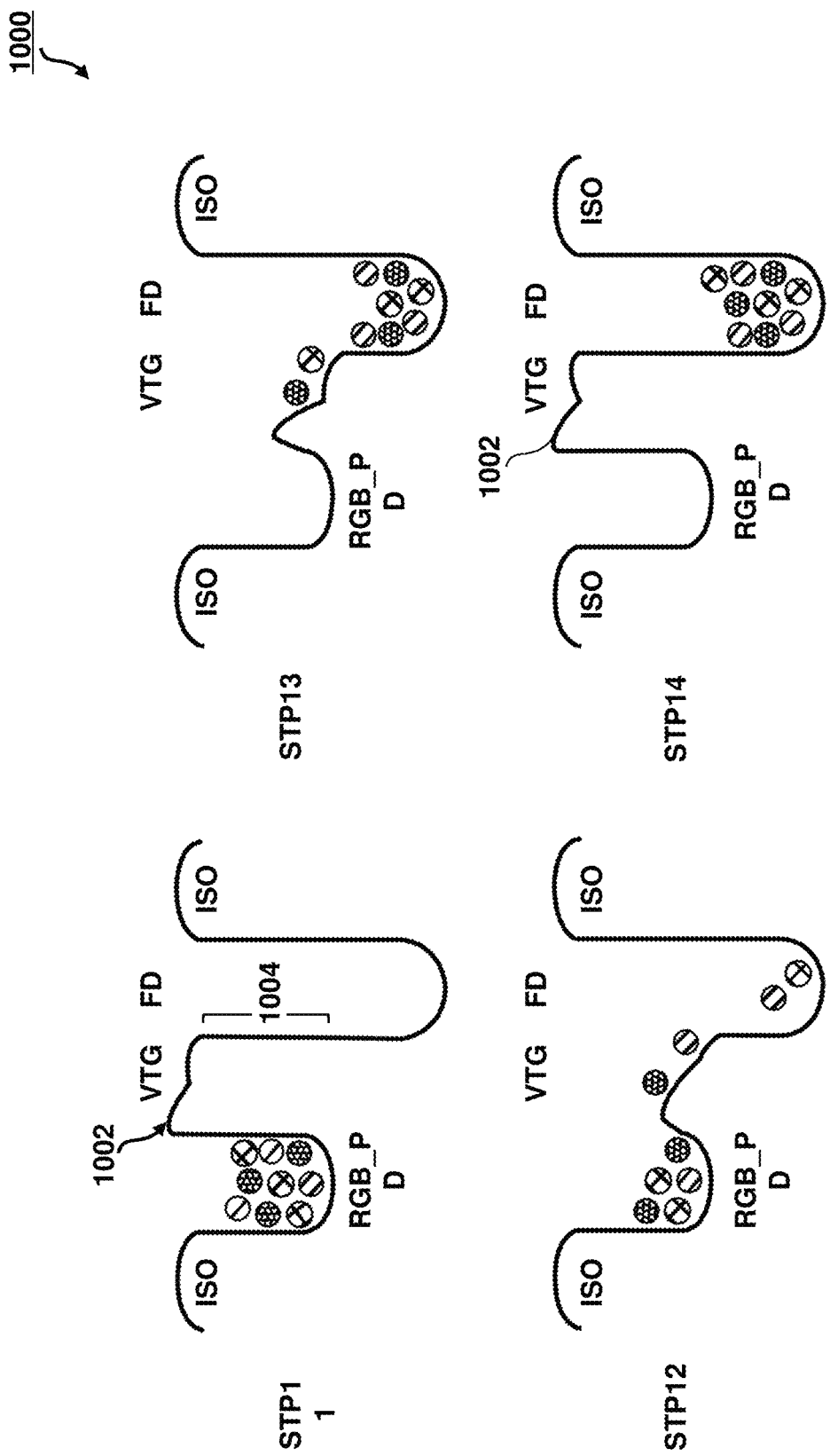
FIG. 10 illustrates a band diagram of a unit pixel according to some embodiment of the present disclosure.

Referring now to FIG. 9, FIG. 9 illustrates band diagrams 900 of unit pixel 10 according to some embodiment of the present disclosure. band diagram 900 is a diagram plotting various charges during the operation of unit pixel 10 (e.g., 10A, 10B, 10C, 10D, and/or 10E). In operation STP01, unit pixel 10 has completed the light exposure. Equivalent charges of the visible light detected are stored in a photosensitive region RGB_PD and equivalent charges of the infrared light detected are stored in a photosensitive region IR_PD. In operation STP02, the charges stored in the photosensitive region IR_PD are transferred. A bias voltage V1 is supplied to the gate HTG (e.g. gate 118A) to induce a channel (e.g. 118C) under the gate HTG. The potential barrier between the photosensitive region IR_PD and the charge storage region FD is lowered such that the equivalent charges of the detected infrared light begins to be transferred to the storage region FD. In operation STP03, the charges stored in the photosensitive region IR_PD are completely transferred to the charge storage region PD. The equivalent charge of the detected infrared light is read out from the charge storage region FD as an IR voltage signal. In operation STP04, the charge storage region PD is reset by supplying a reset voltage to the charge storage region FD. And, the potential barrier between the photosensitive region IR_PD and the charge storage region FD is reimplemented by removing the bias voltage V1 from the gate HTG. In operation STP05, the charges stored in the photosensitive region RGB_PD are transferred. A bias voltage V2 is supplied to the gate VTG to induce a channel around the gate VTG. The potential barrier between the photosensitive region RGB_PD and the charge storage region FD is lowered such that the equivalent charges of the detected visible light begins to be transferred to the storage region FD. In operation STP06, the charges stored in the photosensitive region RGB_PD are completely transferred to the charge storage region FD. The equivalent charge of the detected visible light is read out from the charge storage region FD as an RGB voltage signal.

Referring now to FIG. 10 FIGS. 1-7 and 12-13, FIG. 10 illustrates energy band diagrams 1000 of an exemplary unit pixel 10 (e.g., 10A, 10B, 10C, 10D, 10E) according to one or more embodiments. band diagram 1000 illustrates the operation of a photodiode in an exemplary unit pixel 10 having anti-spill-back layer. In some embodiments, unit pixel 10 comprises an anti-spill-back layer (e.g., doped layer 130/13/13'/13"). In operation STP11, unit pixel 10 has completed the light exposure. Equivalent charges of the visible light detected are stored in a photosensitive region RGB_PD. The anti-spill-back layer may generate potential hump 1002. Potential hump 1002 may be generated through the dopant concentration difference between the anti-spill-back layer (e.g., layer 13) and adjacent layers (e.g., 120, 140). Proper arrangement of dopant concentration differentiation in these layers may create effective potential bump that enhances the operational performance of unit pixel 10.

For example, a higher dopant concentration in the anti-spill-back layer (e.g., layer 13) helps to improve device property. In some embodiments, barrier height 1004 of potential bump 1002 may be configured to be about 25.6 mV. To this end, it is found that this target potential bump may be achieved when the dopant concentration in the anti-spill-back layer (e.g., layer 13) may be about 2.7 times of that in the neighboring layer (e.g., layer 14). However, it should be noted that an overly large difference in dopant concentration may lead to adverse effect such as worsening of the blooming issue.

In operation STP12, the charges stored in the photosensitive region RGB_PD are transferred to the charge storage region FD upon activating the gate VTG. (e.g., 119A) A bias voltage V2 may be supplied to the gate VTG to induce a channel (e.g., 119c) around the gate VTG. The designs for the channel doping profile and gate bias for switch-on the gate VTG are optimized. The profile of the vertical induced channel in the band diagram is shown to be smooth to allow the charges stored in the photosensitive region RGB_PD to be effectively transferred through the vertical channel and into the charge storage region FD. The charges stored in the photosensitive region RGB_PD are transferred to the storage region FD with sufficient kinetic energy. Thus, the transfer of the charges stored in the photosensitive region RGB_PD are not inhibited by the potential hump. In operation STP13, potential hump 1002 may be implemented when almost all of the charges stored in the photosensitive region RGB_PD are transferred to the storage region FD. Potential hump generates 1002 a potential barrier such that the charges previously stored in the photosensitive region RGB_PD will not spill back once the charge has passed the hump. In operation STP14, the transfer of charges to the storage region FD is finished without having spill back.

Figure 11:
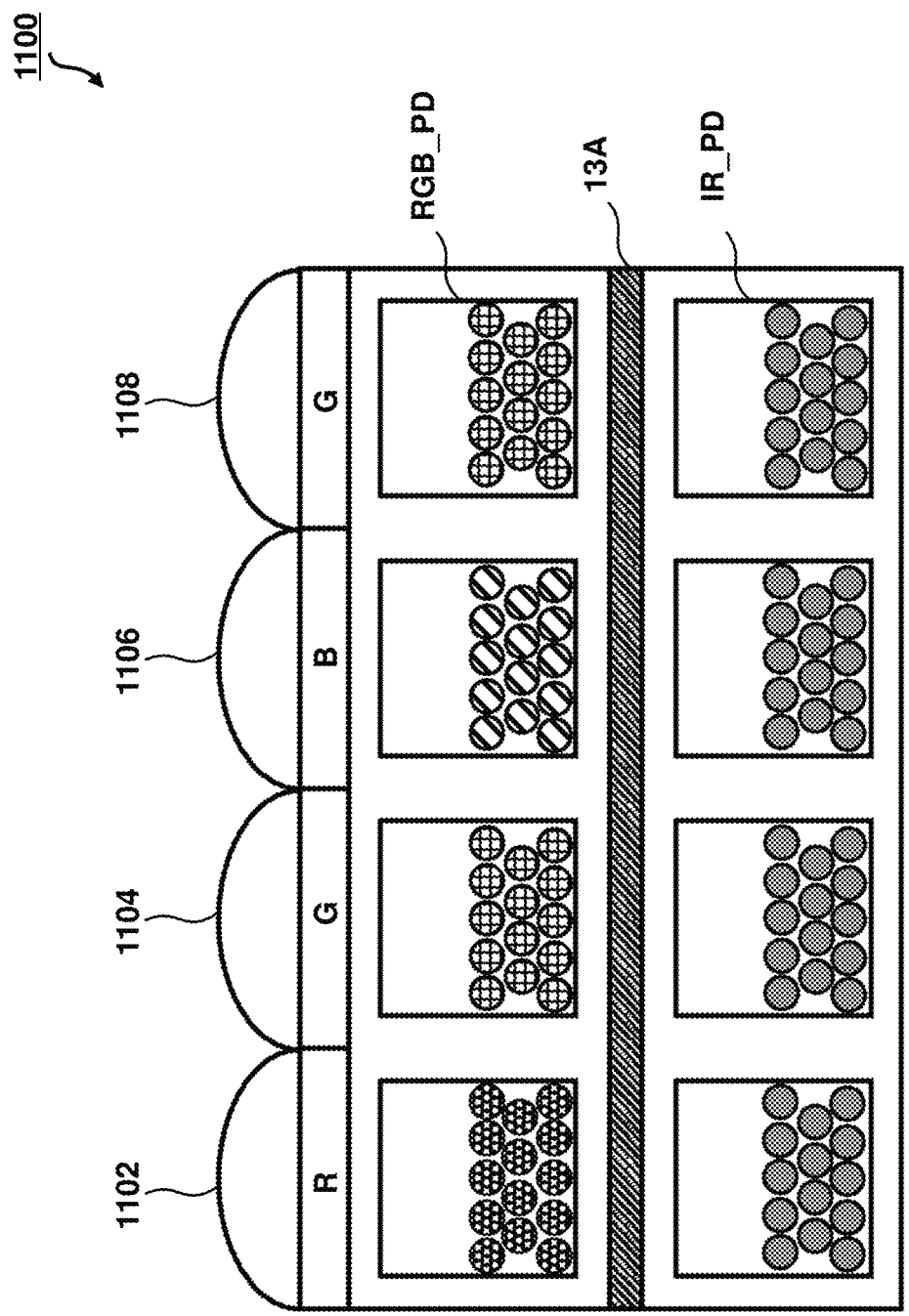
FIG. 11 illustrates a cross sectional view of a sensing unit according to some embodiment of the present disclosure.

Referring now to FIG. 11, FIG. 11 illustrates a cross sectional view of a sensing unit 1100 according to some embodiment of the present disclosure. Sensing unit 100 comprises four unit pixels having dual-photodiode structure. Sensing unit 100 includes one red pixel 1102, one blue pixel 1106 and two green pixels 1104, 1108 arranged in a RGBG pattern as shown in FIG. 11. Since the light absorption depth is dependent on wavelength, the photosensitive regions for visible light such as RGB color light are disposed near the light incident surface while the photosensitive regions for IR light are located farther from the light incident surface.

In some embodiments, an interlayer 13A may be formed as an isolating potential barrier to avoid mixing signal charges from the photosensitive regions for visible light and IR light. IR-cut free color filters are used to allow the IR radiation to pass though the pixels. When the light is incident on the back side of pixel 1102, 1104, 1106, 1108, at least some or every pixel of sensing unit 100 receives both RGB-band and IR-band of the incident light. Therefore, with the dual-photodiode pixels proposed according to the embodiments of the present disclosure, the signal acquisitions for both RGB-band and IR-band are more efficient and cost-effective with only a single chip than the conventional RGB-IR image sensors that need to combine separate sensor chips for RGB-band and IR-band.

In some embodiments of the present disclosure, a sensing unit may include four dual-photodiode pixels. One of the dual-photodiode pixels comprises two photodiodes that are both sensitive to RGB light. One may be used to photoelectrically convert red light into red-color signal charges, the other may be used to photoelectrically convert blue light into blue-color signal charges. As a result, from the dependence of light absorption depth on light wavelength, the shallower region near the incident surface is more responsive to the short-wavelength light and the deeper region is more responsive to the long-wavelength light. Therefore, the photodiode for the blue light may be disposed near the incident surface, while the photodiode for the red light may be located farther from the light incident surface. Also, an interlayer 13A may be formed as an isolating potential barrier in order to avoid mixing signal charges from the two photosensitive regions for the red light and blue light.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A unit pixel structure including a first photodiode and a second photodiode, comprising:
   a semiconductive stack having a front side and a back side opposite the front side, the semiconductive stack comprising:
   a first doped layer;
   a second doped layer disposed over the first doped layer;
   a third doped layer disposed over the second doped layer; and
   a fourth doped layer disposed over the third doped layer, wherein the fourth doped layer is separate from the first doped layer;
   a sensor well region formed within the fourth doped layer;

a floating diffusion region formed within the fourth doped layer and separate from the sensor well region;
a first gate structure disposed over the semiconductive stack and positioned between the sensor well region and the floating diffusion region; and
a second gate structure arranged around the floating diffusion region and extending through the third doped layer, wherein the third doped layer has a heavier doping concentration than the fourth doped layer,
wherein the first photodiode includes the second doped layer,
wherein the second photodiode includes the sensor well,
wherein the third doped layer is arranged between the floating diffusion region and the first photodiode so as to build a potential hump between the floating diffusion region and the first photodiode,
wherein the first doped layer, the third doped layer, and the fourth doped layer are of a first dopant type, and the second doped layer is of a second dopant type, and
wherein the third doped layer is entirely p-type or entirely n-type.

2. The structure of claim 1, wherein an area of the sensor well region is less than an area of the second doped layer.

3. The structure of claim 2, wherein the area of the sensor well region is in a range of about 10% to 90% of the area of the second doped layer.

4. The structure of claim 1, further comprising:
a pinning implant region formed over the sensor well region in the fourth doped layer.

5. The structure of claim 1, wherein a doping concentration of the third doped layer is about 1 to 10 times heavier than the fourth doped layer.

6. The structure of claim 1, wherein the first dopant type is p-type, and the second dopant type is n-type.

7. The structure of claim 1, wherein a thickness of the first doped layer ranges from about 0.1 μm to 3 μm, a thickness of the second doped layer ranges from about 0.5 μm to 3 μm, a thickness of the third doped layer ranges from about 0.1 μm to 1 μm, and a thickness of the fourth doped layer ranges from about 1 μm to 5 μm.

8. The structure of claim 1, wherein the first gate structure protrudes from the semiconductive stack and the second gate structure has a height less than a height of protrusion of the first gate structure.

9. The structure of claim 1, wherein the second gate structure is formed on a periphery of the semiconductive stack and laterally surround the semiconductive stack.

10. The structure of claim 9, wherein the second gate structure penetrates through the entire semiconductive stack.

11. The structure of claim 10, wherein the second gate structure comprises a gate electrode and a gate insulating layer surrounding the gate electrode, wherein the gate insulating layer exposes from the back side of the semiconductive stack, and wherein the gate electrode and the gate insulating layer expose from front side.

12. The structure of claim 9, further comprising:
a gate isolation well region extending across a thickness of the semiconductive stack and extending laterally along an inner periphery of the second gate structure.

13. The structure of claim 1, further comprising:
an isolation structure laterally surrounding the semiconductive stack, the isolation structure penetrating through an entirety of the semiconductive stack.

14. The structure of claim 13, further comprising:
a transfer region surrounding the second gate structure.

15. The structure of claim 14, wherein the transfer region comprises a doped layer of single dopant type having substantially uniform dopant distribution.

16. The structure of claim 14, wherein the transfer region comprises a doped layer of single dopant type having graded dopant distribution.

17. The structure of claim 14, wherein the transfer region comprises a doped layer of dual dopant type having graded dopant distribution across a depth thereof.

18. The structure of claim 13, wherein the isolation structure comprises:
an insulator insert laterally surrounding the semiconductive stack;
a dielectric layer encapsulating the insulator insert;
a shallow well region being formed over the dielectric layer and the insulator insert; and
a deep well region laterally surrounding the dielectric layer and the shallow well region.

19. The structure of claim 18, wherein the insulator insert is made of dielectric materials including oxide, nitride and oxynitride.

20. The structure of claim 13, wherein the isolation structure comprises:
a silicon insert laterally surrounding the semiconductive stack;
a dielectric layer laterally surrounding the silicon insert; and
a deep well region laterally surrounding the dielectric layer.

21. The structure of claim 20, wherein the silicon insert is made of poly silicon.

22. The structure of claim 20, wherein a dopant type of the silicon insert is different from a dopant type of the second gate structure.

23. The structure of claim 22, wherein the dopant type of the silicon insert is p-type and the dopant type of the second gate structure is n-type.

24. The structure of claim 20, wherein the silicon insert is exposed from the front side, and electrically coupled to a voltage supply.

25. An image sensor structure including a first photodiode and a second photodiode, comprising:
a semiconductive stack having a front side and a back side opposite the front side, the semiconductive stack comprising:
a first doped layer;
a second doped layer disposed over the first doped layer;
a third doped layer disposed over the second doped layer; and
a fourth doped layer disposed over the third doped layer, wherein the fourth doped layer is separate from the first doped layer;
a plurality of unit pixels formed in the semiconductive stack and arranged in a matrix pattern, each one of the plurality of unit pixels comprising:
a sensor well region formed within the fourth doped layer;
a floating diffusion region formed within the fourth doped layer and separate from the sensor well region;
a first gate structure disposed over the semiconductive stack and positioned between the sensor well region and the floating diffusion region; and
a second gate structure arranged around the floating diffusion region and extending through the third doped layer, wherein the third doped layer has a heavier doping concentration than the fourth doped layer, wherein the first photodiode includes the second doped layer, wherein the second photodiode includes the sensor well, wherein the third doped layer is arranged between the floating diffusion region and the first photodiode so as to build a potential hump between the floating diffusion region and the first photodiode, wherein the first doped layer, the third doped layer, and the fourth doped layer are of a first dopant type, and the second doped layer is of a second dopant type, and wherein the third doped layer is entirely p-type or entirely n-type.

26. The structure of claim 25, wherein each unit pixel of the plurality of unit pixels further comprises:
a pinning implant region formed over the sensor well region in the fourth doped layer.

27. The structure of claim 25, wherein a doping concentration of the third doped layer is about 1 to 10 times heavier than a doping concentration of the fourth doped layer.

28. The structure of claim 25, wherein the first dopant type is p-type, and the second dopant type is n-type.

29. The structure of claim 25, wherein a thickness of the first doped layer ranges from about 0.1 μm to 3 μm, a thickness of the second doped layer ranges from about 0.5 μm to 3 μm, a thickness of the third doped layer ranges from about 0.1 μm to 1 μm, and a thickness of the fourth doped layer ranges from about 1 μm to 5 μm.

30. The structure of claim 25, wherein the first gate structure is protruding from the semiconductive stack and the second gate structure has a height less than a height of protrusion of the first gate structure.

31. The structure of claim 25, wherein the second gate structure forms a grid pattern in the semiconductive stack, and wherein the sensor well region, the first gate structure, and the floating diffusion region of each unit pixel of the plurality of unit pixels is formed within an opening of the grid pattern.

32. The structure of claim 31, further comprising:
a gate isolation well region extending across a thickness of the semiconductive stack and extending laterally along a periphery of the opening.

33. The structure of claim 31, wherein an area of the sensor well region is less than an area of the opening of the grid pattern.

34. The structure of claim 33, wherein the area of the sensor well region is about 10% to 90% of the area of the opening.

35. The structure of claim 31, wherein the second gate structure penetrates through an entirety of the semiconductive stack.

36. The structure of claim 35, wherein the second gate structure comprises a gate electrode and a gate insulating layer surrounding the gate electrode, wherein the gate insulating layer exposes from the back side of the semiconductive stack, and wherein the gate electrode and the gate insulating layer expose from front side.

37. The structure of claim 31, wherein first gate structures of the plurality of unit pixels are electrically coupled to a first voltage supply and the second gate structure is electrically coupled to a second voltage supply.

38. The structure of claim 25, further comprising:
an isolation structure forming a grid pattern that laterally surrounds each of the plurality of unit pixels, the isolation structure penetrating through an entirety of the semiconductive stack, and each unit pixel of the plurality of unit pixels formed within an opening of the grid pattern.

39. The structure of claim 38, further comprising:
a transfer region surrounding the second gate structure.

40. The structure of claim 39, wherein the transfer region comprises a doped layer of single dopant type having substantially uniformed dopant distribution.

41. The structure of claim 39, wherein the transfer region comprises a doped layer of single dopant type having graded dopant distribution.

42. The structure of claim 39, wherein the transfer region comprises a doped layer of dual dopant type having graded dopant distribution across a depth thereof.

43. The structure of claim 38, wherein the isolation structure comprises:
an insulator insert laterally surrounding the semiconductive stack;
a dielectric layer encapsulating the insulator insert;
a shallow well region being formed over the dielectric layer and the insulator insert; and
a deep well region laterally surrounding the dielectric layer and the shallow well region.

44. The structure of claim 43, wherein the insulator insert is made of dielectric materials including oxide, nitride and oxynitride.

45. The structure of claim 38, wherein the isolation structure comprises:
a silicon insert laterally surrounding the semiconductive stack;
a dielectric layer laterally surrounding the silicon insert; and
a deep well region laterally surrounding the dielectric layer.

46. The structure of claim 45, wherein the silicon insert is made of poly silicon.

47. The structure of claim 45, wherein a dopant type of the silicon insert is different from a dopant type of the second gate structure.

48. The structure of claim 47, wherein the dopant type of the silicon insert is p-type and the dopant type of the second gate structure is n-type.

49. The structure of claim 45, wherein the silicon insert is exposed from the front side, and electrically coupled to a voltage supply.

50. The structure of claim 38, wherein an area of the sensor well region is less than an area of the opening of the grid pattern.

51. The structure of claim 50, wherein the area of the sensor well region is about 10% to 90% of the area of the opening.

* * * * *